US012517610B2

(12) United States Patent
Park

(10) Patent No.: US 12,517,610 B2
(45) Date of Patent: Jan. 6, 2026

(54) DISPLAY DEVICE AND TOUCH SYSTEM INCLUDING THE SAME

(71) Applicant: SAMSUNG DISPLAY CO., LTD., Yongin-si (KR)

(72) Inventor: Won Sang Park, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/735,566

(22) Filed: Jun. 6, 2024

(65) Prior Publication Data

US 2025/0173018 A1 May 29, 2025

(30) Foreign Application Priority Data

Nov. 27, 2023 (KR) ........................ 10-2023-0166856

(51) Int. Cl.
*G06F 3/041* (2006.01)
*G06F 3/046* (2006.01)
*H10K 59/40* (2023.01)

(52) U.S. Cl.
CPC ........ *G06F 3/04166* (2019.05); *G06F 3/0412* (2013.01); *G06F 3/046* (2013.01); *G06F 2203/04102* (2013.01); *G06F 2203/04104* (2013.01); *H10K 59/40* (2023.02)

(58) Field of Classification Search
CPC ................. G06F 3/03545; G06F 3/046; G06F 2203/04102; G06F 2203/04104; G06F 2203/04106; G06F 3/0412; G06F 3/04166; G06F 3/0443
See application file for complete search history.

(56) References Cited

U.S. PATENT DOCUMENTS 10,921,908 B2 2/2021 Kim
2021/0055808 A1* 2/2021 Kato ..................... G06F 3/0442
2023/0161435 A1 5/2023 Kim et al.
2024/0045523 A1* 2/2024 Kim .................... G06F 3/03545

FOREIGN PATENT DOCUMENTS

KR 10-2054960 B1 12/2019
KR 10-2610222 B1 12/2023

* cited by examiner

*Primary Examiner* — Robin J Mishler
(74) *Attorney, Agent, or Firm* — F. CHAU & ASSOCIATES, LLC

(57) ABSTRACT

A display device includes a touch panel that includes first dummy electrodes that extends in a first direction and are connected to each other, second dummy electrodes that extend in a second direction that crosses the first direction and are connected to each other, a first sensing electrode disposed between the first dummy electrodes and that electrically floats with the first dummy electrodes, and a second sensing electrode disposed between the second dummy electrodes and that electrically floats with the second dummy electrodes; and a touch panel driver that drives the touch panel.

15 Claims, 17 Drawing Sheets

DISPLAY DEVICE AND TOUCH SYSTEM INCLUDING THE SAME

CROSS-REFERENCE TO RELATED APPLICATION

This application claims priority under 35 U.S.C. § 119 from Korean Patent Application No. 10-2023-0166856, filed in the Korean Intellectual Property Office on Nov. 27, 2023, the contents of which are herein incorporated by reference in their entirety.

TECHNICAL FIELD

Embodiments of the present disclosure are directed to a display device and a touch system that includes the same. More specifically, embodiments of the present disclosure are directed to a display device that includes a touch panel and a touch system that includes the same.

DISCUSSION OF THE RELATED ART

Electronic devices, such as smartphones, digital cameras, notebook computers, navigation systems, and smart televisions, that provide images to users include display devices that display images. A display device generates an image and provides the image to the user through a display screen.

A display device includes a display panel that displays an image, a touch panel disposed on the display panel and that detects a user's touch, and a digitizer disposed under the display panel that detects a touch of a pen. The digitizer may be implemented using an electromagnetic method or an electromagnetic resonance method.

A digitizer includes a plurality of coils. When a user moves a pen on the display device, the pen is driven by an alternating current signal that generates an oscillating magnetic field, and the oscillating magnetic field induces a signal in the coils. A position of the pen is detected through the signal induced in the coil. The digitizer determines the position of the pen by detecting electromagnetic changes that occur as the pen approaches.

Two input devices, such as a touch panel and a digitizer, can be used separately, which increases the thickness of the display device. A technology that reduces the thickness of the display device is desired.

SUMMARY

Embodiments of the present disclosure provide a display device that can detect a first object and a second object through a touch panel.

Embodiments of the present disclosure provide a touch system that includes a display device.

An embodiment of the present disclosure provides a display device that includes: a touch panel that includes first dummy electrodes that extend in a first direction and are connected to each other, second dummy electrodes that extend in a second direction that crosses the first direction and are connected to each other, a first sensing electrode disposed between the first dummy electrodes and that electrically floats with the first dummy electrodes, and a second sensing electrode disposed between the second dummy electrodes and that electrically floats with the second dummy electrodes; and a touch panel driver that drives the touch panel.

The first dummy electrodes may be connected to each other through a connection line, at least two of the first dummy electrodes and the connection line may surround the first sensing electrode, the second dummy electrodes may be connected to each other through the connection line, and at least two of the second dummy electrodes and the connection line may surround the second sensing electrode.

The first dummy electrodes and the first sensing electrode may be formed on the same layer.

The first dummy electrodes, the second dummy electrodes, the first sensing electrode, and the second sensing electrode may be formed on the same layer.

The first sensing electrode may include a first sub-sensing electrode and a second sub-sensing electrode, and at least one of the first dummy electrodes may be disposed between the first sub-sensing electrode and the second sub-sensing electrode.

The first dummy electrodes and the second dummy electrodes may be connected to each other.

The touch panel driver may detect coordinates of a first object in a first touch period of one frame, and may detect coordinates of a second object in a second touch period of the one frame.

The touch panel driver may transmit a touch driving signal to the first sensing electrode in the first touch period, receive a first touch sensing signal from the second sensing electrode in the first touch period, and detect the coordinates of the first object based on the first touch sensing signal.

The touch panel driver may receive a (2-1)-th touch sensing signal from the first sensing electrode in the second touch period, receive a (2-2)-th touch sensing signal from the second sensing electrode in the second touch period, and detect the coordinates of the second object based on the (2-1)-th touch sensing signal and the (2-2)-th touch sensing signal.

The touch panel driver may detect the coordinates of the second object in the second direction based on the (2-1)-th touch sensing signal, and detect the coordinates of the second object in the first direction based on the (2-2)-th touch sensing signal.

The second object may generate an eddy current in at least one of the first dummy electrodes or the second dummy electrodes.

A frequency of the first touch period may be less than a frequency of the second touch period.

The touch panel driver may include a receiver that receives a signal from the touch panel; a transmitter that transmits a signal to the touch panel; a switch portion that selectively connects the first sensing electrode to the receiver or the transmitter; and a sensing controller that controls the receiver, the transmitter, and the switch portion.

The switch portion may connect the first sensing electrode to the transmitter in the first touch period, and may connect the second sensing electrode to the receiver in the second touch period.

The second touch period may include a first sub-touch period and a second sub-touch period; and the touch panel driver may transmit an in-touch signal to the first sensing electrode in the first sub-touch period, receive a (2-1)-th touch sensing signal from the first sensing electrode in the second sub-touch period, receive a (2-2)-th touch sensing signal from the second sensing electrode in the second sub-touch period, and detect coordinates of the second object based on the (2-1)-th touch sensing signal and the (2-2)-th touch sensing signal.

Another embodiment of the present disclosure provides a touch system that includes: a display device; and an input device that generates an eddy current in the display device. The display device includes a touch panel that includes first dummy electrodes that extend in a first direction and are connected to each other, second dummy electrodes that extend in a second direction that crosses the first direction and are connected to each other, a first sensing electrode disposed between the first dummy electrodes and that electrically floats with the first dummy electrodes, and a second sensing electrode disposed between the second dummy electrodes and that electrically floats with the second dummy electrodes; and a touch panel driver that drives the touch panel.

The input device may include an input device driving portion that generates a magnetic field generation signal; a power supply portion that provides power to the input device driving portion; and a magnetic field generation portion that generates a magnetic field that corresponds to the magnetic field generation signal.

The input device driving portion may generate the magnetic field generation signal based on a pressure of the input device.

The input device may further include a pressure measurement portion that measures the pressure of the input device.

The input device may provide the pressure of the input device to the display device.

The input device may indicate to the display device whether the power is provided to the input device driving portion.

The input device may further include a wireless communication portion that performs wireless communication.

A touch period during which coordinates of the input device are detected may include a first sub-touch period and a second sub-touch period. The touch panel driver may transmit an in-touch signal to the first sensing electrode in the first sub-touch period, receive a (2-1)-th touch sensing signal from the first sensing electrode in the second sub-touch period, receive a (2-2)-th touch sensing signal from the second sensing electrode in the second sub-touch period, and detect coordinates of the input device based on the (2-1)-th touch sensing signal and the (2-2)-th touch sensing signal.

The input device may include a receiving portion that receives a signal that corresponds to the in-touch signal; a transmitting portion that transmits the magnetic field generation signal to the magnetic field generation portion; and a switch portion that selectively connects the input device driving portion to the receiving portion or the transmitting portion.

The input device driving portion may control the switch portion, and the switch portion may connect the input device driving portion to the transmitting portion when the input device receives the signal corresponding to the in-touch signal.

Another embodiment of the present disclosure provides a touch panel that includes first dummy electrodes that extend in a first direction and are connected to each other, second dummy electrodes that extend in a second direction that crosses the first direction and are connected to each other, a first sensing electrode disposed between the first dummy electrodes and that electrically floats with the first dummy electrodes, and a second sensing electrode disposed between the second dummy electrodes and that electrically floats with the second dummy electrodes; and a touch panel driver that detects coordinates of a first object in a first touch period of one frame and detects coordinates of a second object in a second touch period of the one frame.

A display device according to embodiments of the present disclosure can detect a touch (or an input) of a first object and a second object without a separate input device such as a digitizer. Accordingly, the thickness of a display device can be reduced, and the cost of a display device can be reduced.

However, the effects of embodiments of the present disclosure are not limited to the above-described effects, and may be variously extended without departing from the spirit and scope of embodiments of the present disclosure.

DETAILED DESCRIPTION

Hereinafter, embodiments of the present disclosure will be described in detail with reference to the accompanying drawings. In addition, embodiments of the inventive concept may take different forms and are not limited to embodiments set forth herein. The embodiments described herein are provided for the purpose of describing the technical features of the inventive concept in sufficient detail for those skilled in the art to easily practice it.

Throughout the specification, when it is described that an element is "connected" to another element, this includes not only being "directly connected", but also being "indirectly connected" with another device in between. The terms used herein are for the purpose of describing specific embodiments and are not intended to limit the scope of the invention.

Hereinafter, embodiments of the present disclosure will be described in detail with reference to the accompanying drawings.

Figure 1:
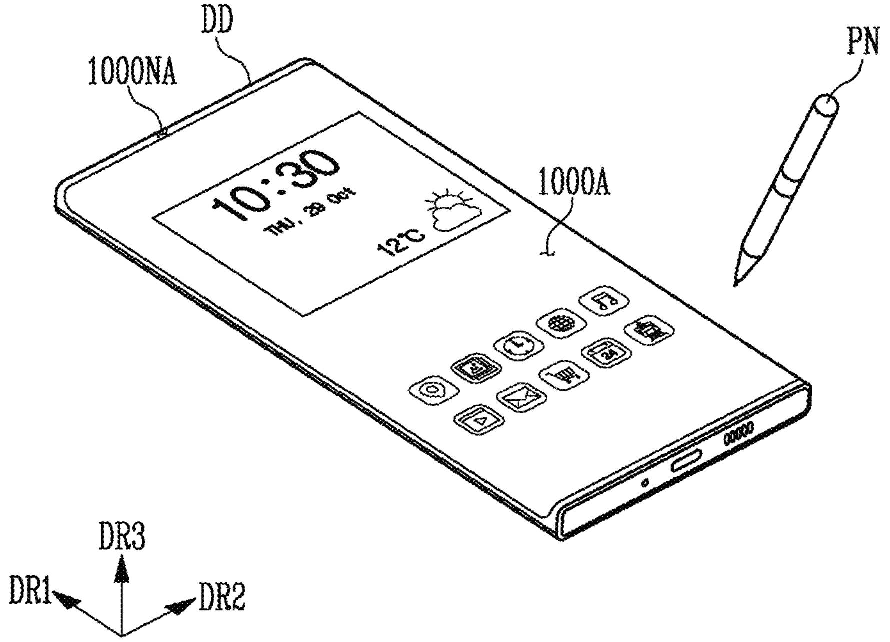
FIG. 1 shows a touch system according to embodiments of the present disclosure.

FIG. 1 shows a touch system according to embodiments of the present disclosure.

Referring to FIG. 1, in an embodiment, the touch system includes a display device DD and an input device PN.

The display device DD can detect a first input by a first object, such as a part of the user's body, and a second input by a second object, such as the input device PN. The display device DD is activated according to an electrical signal. For example, the display device DD is one of a mobile phone, tablet, car navigation system, game console, or wearable device, but is not necessarily limited thereto. FIG. 1 illustrates a case in which the display device DD is a mobile phone.

An active area 1000A and a peripheral area 1000NA are defined in the display device DD. The display device DD displays an image through the active area 1000A. The active area 1000A includes a surface defined by a first direction DR1 and a second direction DR2 that crosses the first direction DR1. The peripheral area 1000NA surrounds the active area 1000A. The image is displayed in a third direction DR3 that is normal to a plane defined by the first and second directions DR1, DR2.

The display device DD can detect a first input. The first input is one of various types of external inputs, such as a part of the user's body, light, heat, or pressure.

The display device DD illustrated in FIG. 1 can detect the second input from the input device PN. The input device PN is a device other than the user's body. For example, the input device PN is one of an active electrostatic (AES) pen, an electro-magnetic resonance (EMR) pen, a stylus pen, a touch pen, or an electronic pen.

Figure 2:
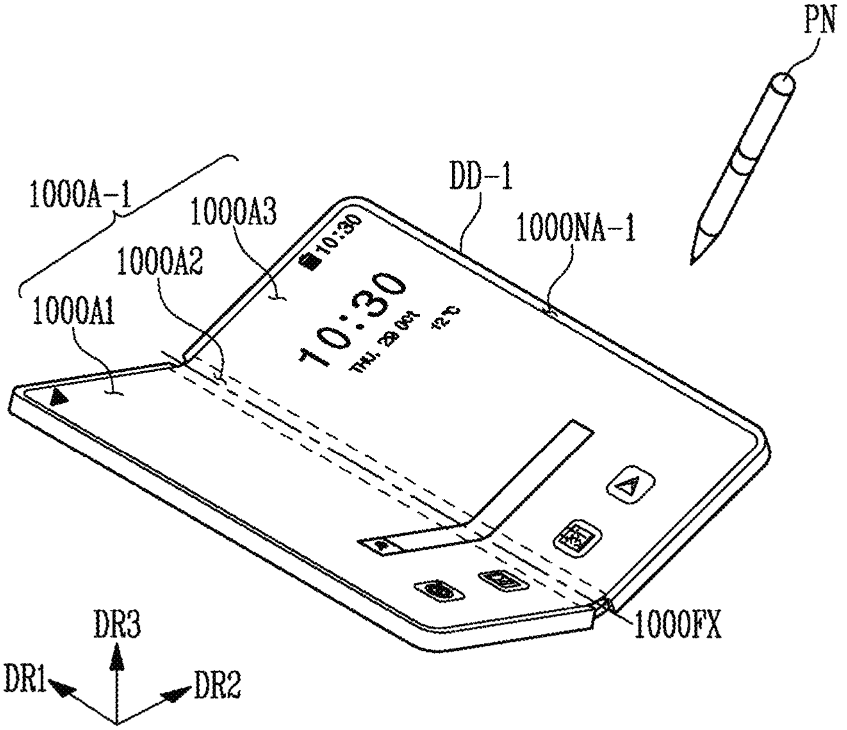
FIG. 2 shows a touch system according to embodiments of the present disclosure.

FIG. 2 illustrates a touch system according to embodiments of the present disclosure. In describing FIG. 2, the same or similar reference numerals are used for components described with reference to FIG. 1, and their description is omitted.

FIG. 2 shows a display device DD-1 being folded at a predetermined angle. Referring to FIG. 2, in an embodiment, when the display device DD-1 is unfolded, an active area 1000A-1 includes a plane defined by the first direction DR1 and the second direction DR2.

The active area 1000A-1 includes a first area 1000A1, a second area 1000A2, and a third area 1000A3. The first area 1000A1, the second area 1000A2, and the third area 1000A3 are sequentially defined in the second direction DR2. The second area 1000A2 can be bent with respect to a folding axis 1000FX that extends in the first direction DR1. Accordingly, the first area 1000A1 and the third area 1000A3 may be referred to as non-foldable areas, and the second area 1000A2 may be referred to as a foldable area.

When the display device DD-1 is folded, the first area 1000A1 and the third area 1000A3 may face each other. Therefore, in a completely folded state, the active area 1000A-1 is not externally exposed, which may be referred to as in-folding. However, this is an example, and the operation of the display device DD-1 is not necessarily limited thereto.

For example, when the display device DD-1 is folded, the first area 1000A1 and the third area 1000A3 may face opposite directions. Therefore, in a completely folded state, the active area 1000A-1 is externally exposed, which may be referred to as out-folding.

In an embodiment, the display device DD-1 is capable of one of an in-folding operation or an out-folding operation. In an embodiment, the display device DD-1 is capable of both an in-folding operation and an out-folding operation. For example, the same area of the display device DD-1, for example, the second area 1000A2 can be in-folded or out-folded.

Although one foldable area and two non-foldable areas are illustrated as an example in FIG. 2, the number of foldable areas and non-foldable areas is not necessarily limited thereto. For example, in some embodiments, the display device DD-1 includes two or more non-foldable areas and a plurality of foldable areas disposed between adjacent non-foldable areas.

FIG. 2 shows that the folding axis 1000FX extends in the first direction DR1, but embodiments of a present disclosure are not necessarily limited thereto. For example, in some embodiments, the folding axis 1000FX extends in the second direction DR2. For example, the first area 1000A1, the second area 1000A2, and the third area 1000A3 are sequentially arranged along the first direction DR1.

Figure 3:
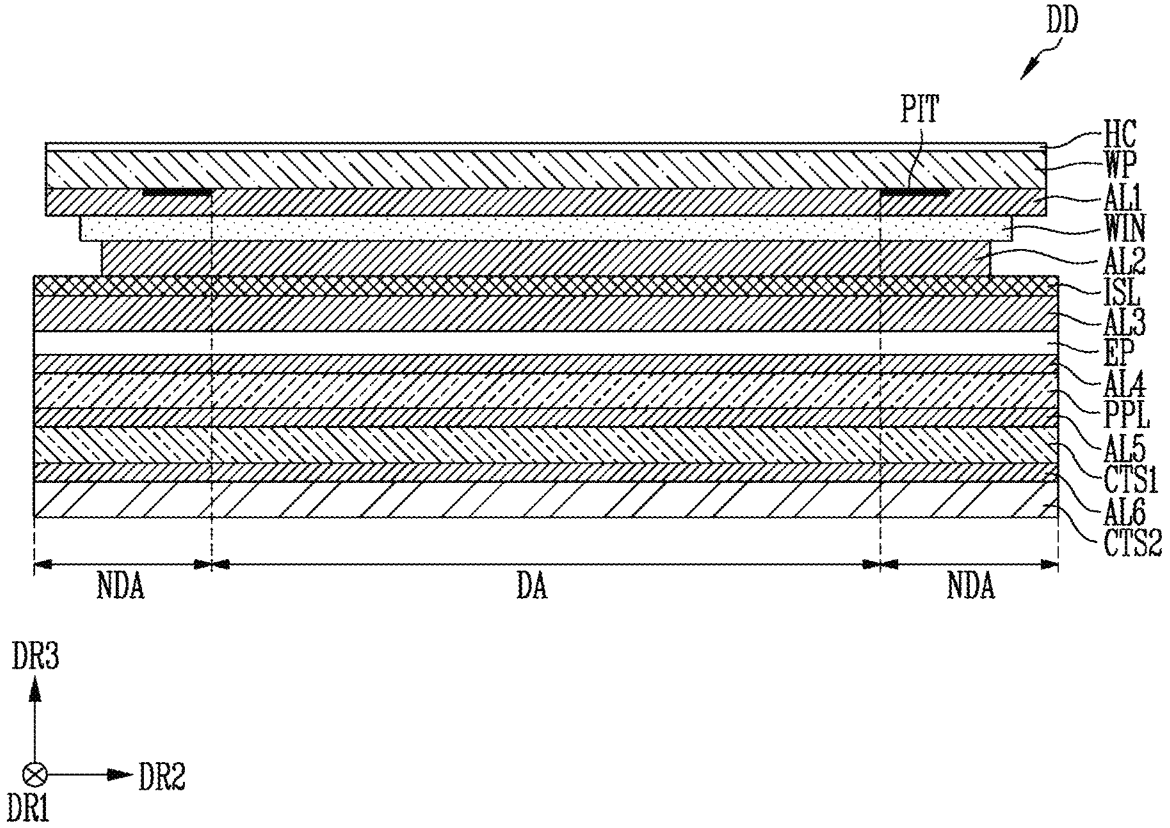
FIG. 3 is a cross-sectional view of a display device of FIG. 1.

FIG. 3 is a cross-sectional view of a display device of FIG. 1.

Referring to FIG. 3, in an embodiment, the display device DD includes an electronic panel EP, an impact absorption layer ISL, a panel protection layer PPL, a first conductive sheet CTS1, a second conductive sheet CTS2, a window WIN, a window protection layer WP, a hard coating layer HC, and first to sixth adhesive layers AL1 to AL6.

The electronic panel EP can display an image, sense the above-described first and second inputs, and reduce reflectance of external light. The electronic panel EP includes a display panel, a touch panel, and an anti-reflection layer, and a configuration of the electronic panel EP will be described with reference to FIG. 4 below.

The impact absorption layer ISL is disposed above the electronic panel EP. The impact absorption layer ISL protects the electronic panel EP by absorbing external impacts. The impact absorption layer ISL may be manufactured in the form of a stretched film.

The impact absorption layer ISL includes a flexible plastic material. The flexible plastic material may be a synthetic resin film. For example, the impact absorption layer ISL includes a flexible plastic material such as polyimide (PI) or polyethyleneterephthalte (PET).

The panel protection layer PPL is disposed under the electronic panel EP. The panel protection layer PPL protects a lower portion of the electronic panel EP. The panel protection layer PPL includes a flexible plastic material. For example, the panel protection layer PPL includes polyethylene terephthalate (PET).

The first conductive sheet CTS1 is disposed under the panel protection layer PPL. The second conductive sheet CTS2 is disposed under the first conductive sheet CTS1. The first conductive sheet CTS1 and the second conductive sheet CTS2 each include a metal.

The first conductive sheet CTS1 includes a ferromagnetic material. For example, the first conductive sheet CTS1 is a ferrite sheet. The second conductive sheet CTS2 includes a diamagnetic material. For example, the second conductive sheet CTS2 is a copper sheet. The first and second conductive sheets CTS1 and CTS2 shield the electronic panel EP from external magnetic fields being applied to the lower portion of the display device DD.

The window WIN is disposed above the impact absorption layer ISL. The window WIN protects the electronic panel EP from external scratches. The window WIN is optically transparent. The window WIN may include glass. However, embodiments are not necessarily limited thereto, and the window WIN may include a synthetic resin film.

The window WIN may have a multi-layered structure or a single-layered structure. For example, in some embodiments, the window WIN includes a plurality of synthetic resin films bonded with an adhesive, or in some embodiments includes a glass substrate and a synthetic resin film bonded with an adhesive.

The window protection layer WP is disposed above the window WIN. The window protection layer WP includes a flexible plastic material such as polyimide or polyethyleneterephthalate. The hard coating layer HC is disposed on an upper surface of the window protection layer WP.

A printed layer PIT is disposed on the lower surface of the window protection layer WP. The printed layer PIT is black, but a color of the printed layer PIT is not necessarily limited thereto. The printed layer PIT is adjacent to the edge of the window protection layer WP. The printed layer PIT overlaps the non-display area NDA.

The first adhesive layer AL1 is disposed between the window protection layer WP and the window WIN. The window protection layer WP and the window WIN are bonded to each other by the first adhesive layer AL1. The first adhesive layer AL1 covers the printed layer PIT.

The second adhesive layer AL2 is disposed between the window WIN and the impact absorption layer ISL. The window WIN and the impact absorption layer ISL are bonded to each other by the second adhesive layer AL2.

The third adhesive layer AL3 is disposed between the impact absorption layer ISL and the electronic panel EP. The impact absorption layer ISL and the electron panel EP are bonded to each other by the third adhesive layer AL3.

The fourth adhesive layer AL4 is disposed between the electronic panel EP and the panel protection layer PPL. The electronic panel EP and the panel protection layer PPL are bonded to each other by the fourth adhesive layer AL4.

The fifth adhesive layer AL5 is disposed between the panel protection layer PPL and the first conductive sheet CTS1. The panel protection layer PPL and the first conductive sheet CTS1 are bonded to each other by the fifth adhesive layer AL5.

The sixth adhesive layer AL6 is disposed between the first conductive sheet CTS1 and the second conductive sheet CTS2. The first conductive sheet CTS1 and the second conductive sheet CTS2 are bonded to each other by the sixth adhesive layer AL6.

The first to sixth adhesive layers AL1 to AL6 each include at least one of a pressure sensitive adhesive (PSA) or an optically clear adhesive (OCA), but the type of the adhesive is not necessarily limited thereto.

Figure 4:
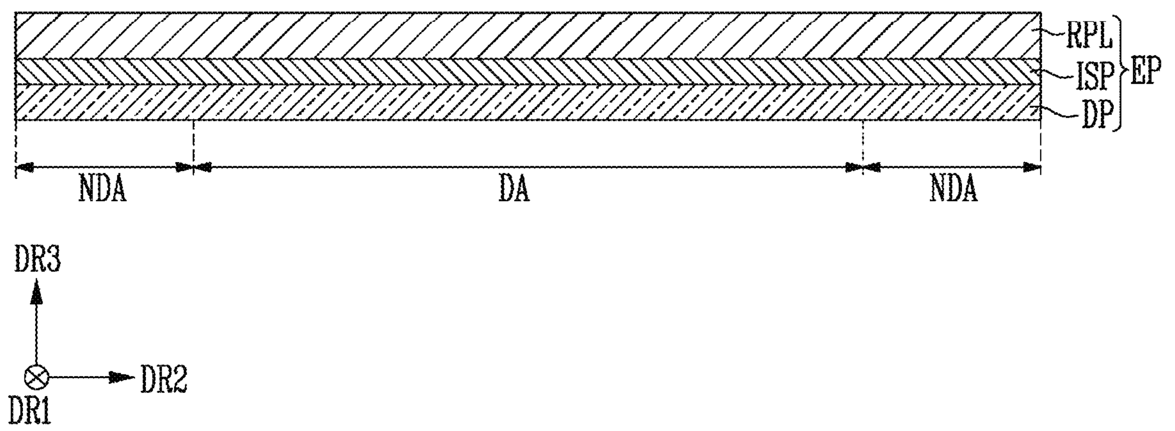
FIG. 4 is a cross-sectional view of an electronic panel of FIG. 3.

FIG. 4 is a cross-sectional view of an electronic panel of FIG. 3.

Referring to FIG. 4, in an embodiment, the electronic panel EP includes a display panel DP, a touch panel ISP disposed on the display panel DP, and an anti-reflection layer RPL disposed on the touch panel ISP. The display panel DP is a flexible display panel. For example, the display panel DP includes a flexible substrate and a plurality of elements disposed on the flexible substrate.

In an embodiment, the display panel DP is a light emitting type display panel. However, embodiments of the present disclosure are not necessarily limited to the type of display panel DP. For example, the display panel DP is one of an organic light emitting display panel, a quantum dot display panel, a micro LED display panel, or a nano LED display panel. A light emitting layer of an organic light emitting display panel includes an organic light emitting material. A light emitting layer of a quantum dot display panel includes a quantum dot and/or a quantum rod. A light emitting layer of a micro LED display panel includes a micro LED. A light emitting layer of a nano LED display panel includes a nano LED. Hereinafter, the display panel DP will be described as an organic light emitting display panel.

The touch panel ISP includes sensing electrodes, hereinafter shown in FIG. 8, that sense a first input and a second input. The touch panel ISP is directly formed on the display panel DP when the electronic panel EP is manufactured.

The anti-reflection layer RPL is disposed on the touch panel ISP. The anti-reflection layer RPL is directly formed on the touch panel ISP when the electron panel EP is manufactured. The anti-reflection layer RPL is an anti-reflection film for external light. The anti-reflection layer RPL reduces reflectance of external light incident on the display panel DP.

In an embodiment, the touch panel ISP is directly formed on the display panel DP, and the anti-reflection layer RPL is directly formed on the touch panel ISP, but embodiments of the present disclosure are not necessarily limited thereto. For example, in some embodiments, the touch panel ISP is separately manufactured and attached to the display panel DP by an adhesive layer, and the anti-reflection layer RPL is separately manufactured and attached to the touch panel ISP by an adhesive layer.

Figure 5:
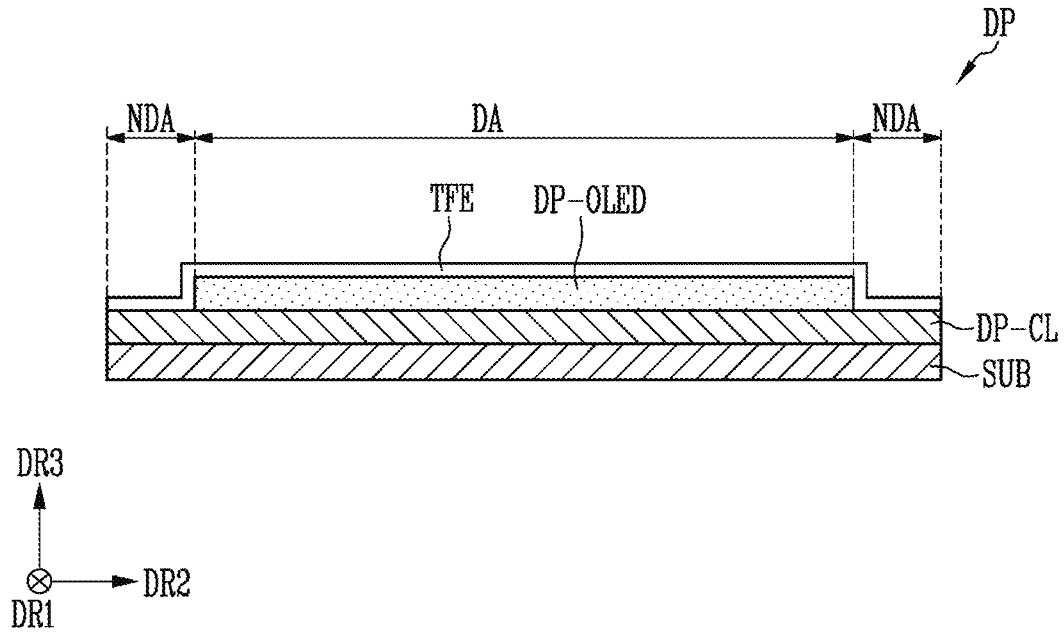
FIG. 5 is a cross-sectional view of a display panel of FIG. 4.

FIG. 5 is a cross-sectional view of a display panel of FIG. 4.

Referring to FIG. 5, the display panel DP includes a substrate SUB, a circuit element layer DP-CL disposed on the substrate SUB, a display element layer DP-OLED disposed on the circuit element layer DP-CL, and a thin film encapsulation layer TFE disposed on the display element layer DP-OLED.

The substrate SUB includes a display area DA and a non-display area NDA around the display area DA. The substrate SUB includes a flexible plastic material such as polyimide (PI).

The substrate SUB provides a base surface on which the circuit element layer DP-CL is disposed. The substrate SUB is one of a glass substrate, a metal substrate, or a polymer substrate. However, embodiments are not necessarily limited thereto, and in some embodiments, the substrate SUB is one of an inorganic layer, an organic layer, or a composite material layer.

The substrate SUB has a multi-layered structure. For example, the substrate SUB includes a first synthetic resin layer, a silicon oxide (SiOx) layer disposed on the first synthetic resin layer, an amorphous silicon (a-Si) layer disposed on the silicon oxide layer, and a second synthetic resin layer disposed on the amorphous silicon layer. The silicon oxide layer and the amorphous silicon layer may be referred to as a base barrier layer.

Each of the first and second synthetic resin layers include a polyimide-based resin. In addition, each of the first and second synthetic resin layers include at least one of an acrylic resin, a methacrylate resin, a polyisoprene resin, a vinyl resin, an epoxy resin, a urethane resin, a cellulose resin, a siloxane resin, a polyamide resin, or a perylene resin. In the present specification, the "~~" resin includes a functional group of "~~".

The circuit element layer DP-CL is disposed on the substrate SUB. The circuit element layer DP-CL includes an insulating layer, a semiconductor pattern, a conductive pattern, and a signal line. The insulating layer, the semiconductor layer, and the conductive layer can be formed on the substrate SUB by coating or deposition, etc., and then the insulating layer, the semiconductor layer, and the conductive layer are selectively patterned through a plurality of photolithography processes. Thereafter, the semiconductor pattern, the conductive pattern, and the signal line in the circuit element layer DP-CL are formed.

The display element layer DP-OLED is disposed on the circuit element layer DP-CL. The display element layer DP-OLED is disposed in the display area DA. The display element layer DP-OLED includes a plurality of pixels, hereinafter shown in FIG. 6, that are disposed in the display area DA. Each of the pixels includes a light emitting element connected to a transistor disposed in the circuit element layer DP-CL.

The thin film encapsulation layer TFE is disposed on the circuit element layer DP-CL and covers the display element layer DP-OLED. The thin film encapsulation layer TFE includes inorganic layers and an organic layer between the inorganic layers. The inorganic layers protect the pixels from moisture and oxygen. The organic layer protects the pixels from foreign substances such as dust particles.

Figure 6:
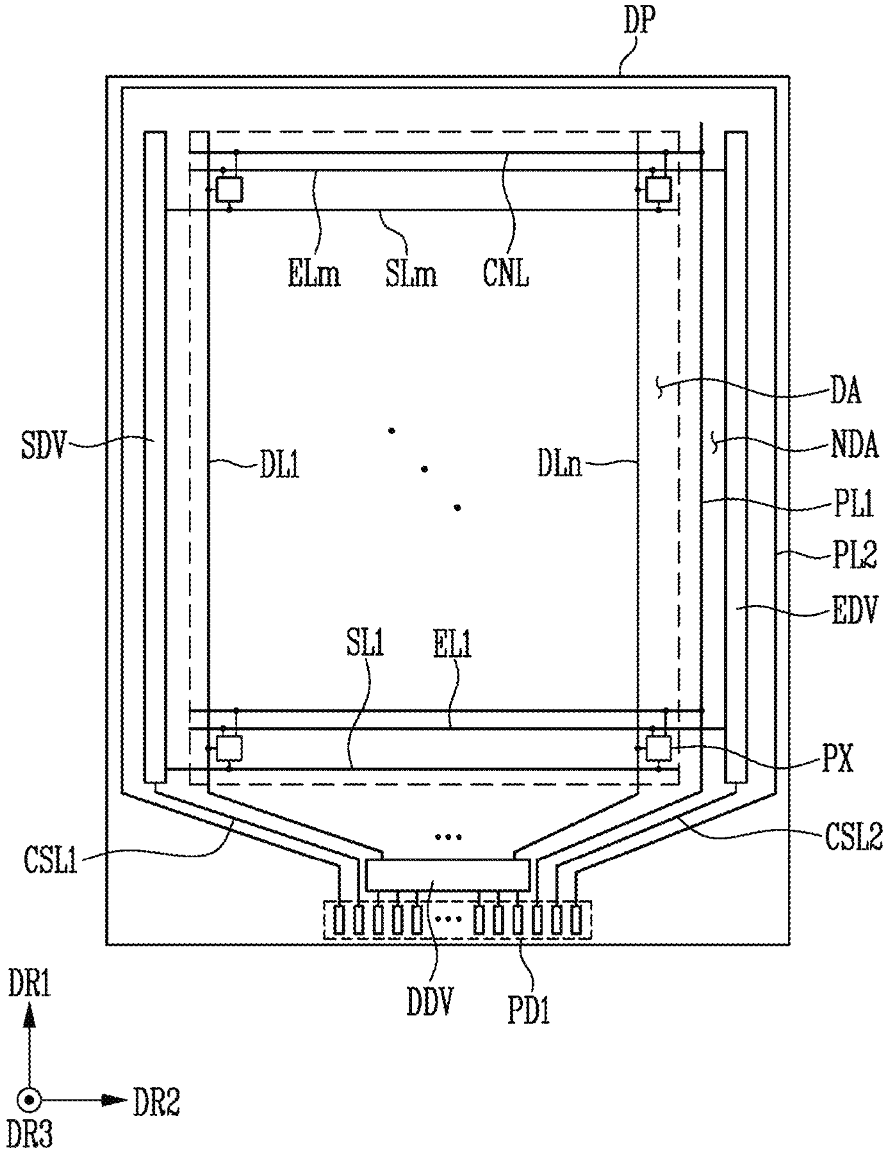
FIG. 6 is a top plan view of a portion of an electronic panel of FIG. 4.

FIG. 6 is a top plan view of a portion of the electronic panel of FIG. 4.

Referring to FIG. 6, in an embodiment, the electronic panel EP (see FIG. 4) includes a display panel DP, a scan driver SDV, a data driver DDV, a light emission driver EDV, and a plurality of first pads PD1.

The display panel DP has a rectangular shape that has long sides that extend in the first direction DR1 and short sides that extend in the second direction DR2, but a shape of the display panel DP is not necessarily limited thereto. The display panel DP includes a display area DA and a non-display area NDA that surrounds the display area DA.

The display panel DP includes a plurality of pixels PX, a plurality of scan lines SL1 to SLm, a plurality of data lines DL1 to DLn, a plurality of light emitting lines EL1 to ELm, first and second control lines CSL1 and CSL2, first and second power lines PL1 and PL2, and connection lines CNL. m and n are positive integers.

The pixels PX are disposed in a display area DA. The scan driver SDV and the light emission driver EDV are disposed in the non-display area NDA on opposite sides of the display area DA adjacent to the long sides of the display panel DP. The data driver DDV is disposed in the non-display area NDA adjacent to one of the short sides of the display panel DP. When viewed in a plan view, the data driver DDV is adjacent to a lower end of the display panel DP.

The scan lines SL1 to SLm extend in the second direction DR2 and are connected to the pixels PX and the scan driver SDV. The data lines DL1 to DLn extend in the first direction DR1 and are connected to the pixels PX and the data driver DDV. The light emitting lines EL1 to ELm extend in the second direction DR2 and are connected to the pixels PX and the light emission driver EDV.

The first power line PL1 extends in the first direction DR1 and is disposed in the non-display area NDA. The first power line PL1 is disposed between the display area DA and the light emission driver EDV.

The connection lines CNL extend in the second direction DR2, are arranged in the first direction DR1 and are connected to the first power line PL1 and the pixels PX. A first voltage is transmitted to the pixels PX through the first power line PL1 and connection lines CNL connected to each other.

The second power line PL2 is disposed in the non-display area NDA, and extends along the long sides of the display panel DP and the other short side of the display panel DP where the data driver DDV is not disposed. The second power line PL2 is disposed outside the scan driver SDV and the light emission driver EDV, between the scan driver SDV and the light emission driver EDV and an edge of the display panel DP.

In addition, the second power line PL2 extends toward the display area DA and is connected to the pixels PX. A second voltage with a level lower than the first voltage is transmitted to the pixels PX through the second power line PL2.

The first control line CSL1 is connected to the scan driver SDV and extends toward a lower end of the display panel DP. The second control line CSL2 is connected to the light emission driver EDV and extends toward the lower end of the display panel DP. The data driver DDV is disposed between the first control line CSL1 and the second control line CSL2.

The first pads PD1 are disposed in the non-display area NDA adjacent to the lower end of the display panel DP, and are closer to the lower end of the display panel DP than the data driver DDV. The data driver DDV, the first power line PL1, the second power line PL2, the first control line CSL1, and the second control line CSL2 are connected to the first pads PD1. The data lines DL1 to DLn are connected to the data driver DDV, and the data driver DDV is connected to the first pads PD1 that respectively correspond to the data lines DL1 to DLn.

In addition, the display device DD further includes a timing controller that controls operations of the scan driver SDV, the data driver DDV, and the light emission driver EDV, and a voltage generation portion that generates the first and second voltages. The timing controller and the voltage generation portion are connected to the first pads PD1 through a printed circuit board. In an embodiment, the timing controller and/or the voltage generation portion are integrated with the data driver DDV.

The scan driver SDV generates a plurality of scan signals, and the scan signals are transmitted to the pixels PX through the scan lines SL1 to SLm. The data driver DDV generates a plurality of data voltages, and the data voltages are transmitted to the pixels PX through the data lines DL1 to DLn. The light emission driver EDV generates a plurality of light emitting signals, and the light emitting signals are transmitted to the pixels PX through light emitting lines EL1 to ELm.

The pixels PX receive the data voltages in response to the scan signals. The pixels PX display an image by emitting light having a luminance that corresponds to the data voltages in response to the light emitting signals.

Figure 7:
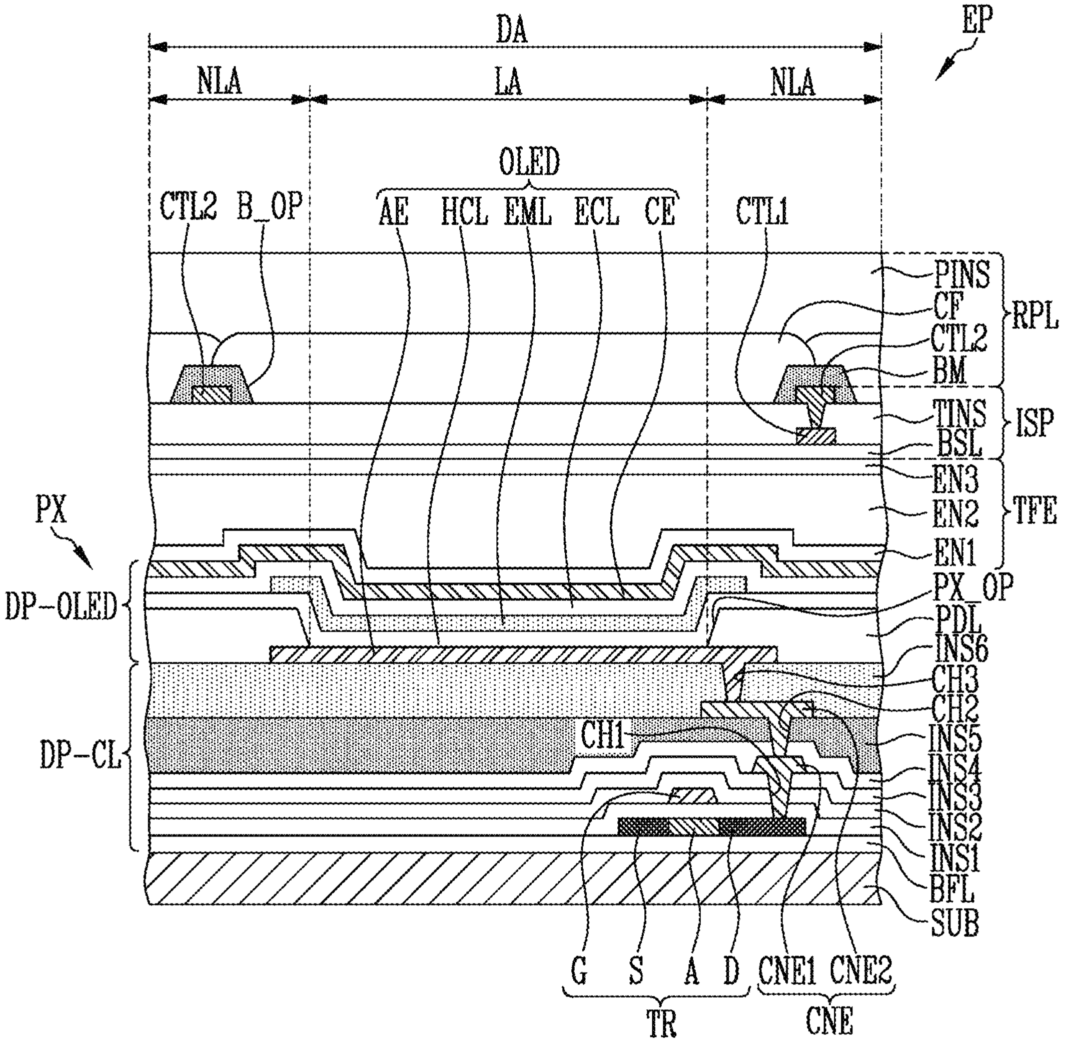
FIG. 7 is a cross-sectional view of an electronic panel of FIG. 4.

FIG. 7 illustrates a cross-sectional view of an electronic panel of FIG. 4.

Referring to FIG. 7, in an embodiment, the pixel PX includes a transistor TR and a light emitting element OLED. The light emitting element OLED includes a first electrode AE (or anode), a second electrode CE (or cathode), a hole control layer HCL, an electron control layer ECL, and a light emitting layer EML.

The transistor TR and the light emitting element OLED are disposed on the substrate SUB. Although one transistor TR is illustrated as an example, substantially, the pixel PX may include a plurality of transistors and at least one capacitor for driving the light emitting element OLED.

The display area DA includes a light emitting area LA that corresponds to each of the pixels PX and a non-light emitting area NLA around the light emitting area LA. The light emitting element OLED is disposed in the light emitting area LA.

A buffer layer BFL is disposed on the substrate SUB, and the buffer layer BFL is an inorganic layer. A semiconductor pattern is disposed on the buffer layer BFL. The semiconductor pattern include at least one of polysilicon, amorphous silicon, or metal oxide.

The semiconductor pattern may be doped with an N-type dopant or a P-type dopant. The semiconductor pattern includes a high-doping area and a low-doping area. The conductivity of the high-doping area is greater than that of the low-doping area, and the high-doping area serves as a source electrode and a drain electrode of the transistor TR. The low-doping area substantially corresponds to an active area (or channel) of the transistor.

The source(S), the active area (A), and the drain (D) of the transistor TR are formed from the semiconductor pattern. A first insulating layer INS1 is disposed on the buffer layer BFL and the semiconductor pattern. The gate (G) of the transistor TR is disposed on the first insulating layer INS1. A second insulating layer INS2 is disposed on the first insulating layer INS1 and the gate (G). A third insulating layer INS3 is disposed on the second insulating layer INS2.

A connection electrode CNE includes a first connection electrode CNE1 and a second connection electrode CNE2 that connect the transistor TR and the light emitting element OLED. The first connection electrode CNE1 is disposed on the third insulating layer INS3, and is connected to the drain (D) through a first contact hole CH1 formed in the first to third insulating layers INS1 to INS3.

A fourth insulating layer INS4 is disposed on the insulating layer INS3 and the first connection electrode CNE1. A fifth insulating layer INS5 is disposed on the fourth insulating layer INS4. The second connection electrode CNE2 is disposed on the fifth insulating layer INS5. The second connection electrode CNE2 is connected to the first connection electrode CNE1 through a second contact hole CH2 formed in the fourth and fifth insulating layers INS4 and INS5.

A sixth insulating layer INS6 may be disposed on the fifth insulating layer INS5 and the second connection electrode CNE2. The layers from the buffer layer BFL to the sixth insulating layer INS6 may be defined as the circuit element layer DP-CL. The first insulating layer INS1 to the sixth insulating layer INS6 may each be an inorganic layer or an organic layer.

The first electrode AE is disposed on the sixth insulating layer INS6. The first electrode AE is connected to the second connection electrode CNE2 through a third contact hole CH3 formed in the sixth insulating layer INS6. A pixel defining film PDL that includes an opening PX_OP that exposes a predetermined portion of the first electrode AE is disposed on the first electrode AE and the sixth insulating layer INS6.

The hole control layer HCL is disposed on the first electrode AE and the pixel defining film PDL. The hole control layer HCL includes a hole transport layer and a hole injection layer.

The light emitting layer EML is disposed on the hole control layer HCL. The light emitting layer EML is disposed in an area that corresponds to the opening PX_OP. The light emitting layer EML may include an organic material and/or an inorganic material. The light emitting layer EML generates one of red, green, or blue light.

The electron control layer ECL is disposed on the light emitting layer EML and the hole control layer HCL. The electron control layer ECL includes an electron transport layer and an electron injection layer. The hole control layer HCL and the electron control layer ECL are commonly disposed in the light emitting area LA and the non-light emitting area NLA.

The second electrode CE is disposed on the electron control layer ECL. The second electrode CE is commonly disposed on the pixels PX. The layers of the light emitting element OLED and the pixel defining film PDL may be defined as the display element layer DP-OLED.

The thin film encapsulation layer TFE is disposed on the second electrode CE and covers the pixel PX. The thin film encapsulation layer TFE includes a first encapsulation layer EN1 disposed on the second electrode CE, a second encapsulation layer EN2 disposed on the first encapsulation layer EN1, and a third encapsulation layer EN3 disposed on the second encapsulation layer EN2.

The first and third encapsulation layers EN1 and EN3 include an inorganic insulating layer, and protect the pixel PX from moisture and oxygen. The second encapsulation layer EN2 includes an organic insulating layer, and protects the pixels PX from foreign substances such as dust particles.

The first voltage is applied to the first electrode AE through the transistor TR, and the second voltage that is lower than the first voltage is applied to the second electrode CE. Holes and electrons injected into the light emitting layer EML combine to form excitons, and as the excitons transition to a ground state, the light emitting element OLED emits light.

The touch panel ISP is disposed on the thin film encapsulation layer TFE. The touch panel ISP is formed directly on an upper surface of the thin film encapsulation layer TFE.

A base layer BSL may be disposed on the thin film encapsulation layer TFE. The base layer BSL includes an inorganic insulating layer. At least one inorganic insulating layer is disposed on the thin film encapsulation layer TFE as the base layer BSL.

The touch panel ISP includes a first conductive pattern CTL1 and a second conductive pattern CTL2 disposed on the first conductive pattern CTL1. The first conductive pattern CTL1 is disposed on the base layer BSL. An insulating layer TINS is disposed on the base layer BSL and covers the first conductive pattern CTL1. The insulating layer TINS may include an inorganic insulating layer or an organic insulating layer. The second conductive pattern CTL2 is disposed on the insulating layer TINS.

The first and second conductive patterns CTL1 and CTL2 overlap the non-light emitting area NLA. In addition, the first and second conductive patterns CTL1 and CTL2 are disposed on the non-light emitting area NLA between the light emitting areas LA and have a mesh shape.

The second conductive pattern CTL2 form the above-described sensing electrodes of the touch panel ISP and dummy electrodes, hereinafter shown in FIG. 8, described below. For example, the mesh-shaped second conductive pattern CTL2 is separated in a predetermined area to form the sensing electrodes and the dummy electrodes. For example, the sensing electrodes and the dummy electrodes are formed in the same layer, and the sensing electrodes and dummy electrodes electrically float.

In an embodiment, the second conductive pattern CTL2 forms a connection line, hereinafter shown in FIG. 8. However, embodiments of the present disclosure are not necessarily limited thereto. For example, in an embodiment, the connection line is formed with a separate conductive pattern.

A portion of the second conductive pattern CTL2 is connected to the first conductive pattern CTL1. The first conductive pattern CTL1 forms a connection electrode, hereinafter shown in FIG. 15, to be described below that connects a portion of the second conductive pattern CTL2. For example, the first conductive pattern CTL1 connects a portion of the separated second conductive pattern CTL2 in the form of a bridge. However, the first conductive pattern CTL1 does not necessarily have to be formed under the second conductive pattern CTL2.

The anti-reflection layer RPL is disposed on the second conductive pattern CTL2. The anti-reflection layer RPL includes a black matrix BM and a plurality of color filters CF. The black matrix BM overlaps the non-light emitting area NLA, and the color filters CF respectively overlap the light emitting areas LA.

The black matrix BM is disposed on the insulating layer TINS and covers the second conductive pattern CTL2. The black matrix BM includes an opening B_OP that overlaps the light emitting area LA and the opening PX_OP. The black matrix BM absorbs and blocks light. A width of the opening B_OP is greater than a width of the opening PX_OP. In an embodiment, the anti-reflection layer RPL replaces the black matrix BM by overlapping different types of color filters CF.

The color filters CF are disposed on the insulating layer TINS and the black matrix BM. The color filters CF are respectively disposed in the openings B_OP. A planarization insulating layer PINS is disposed on the color filters CF. The planarization insulating layer PINS provides a flat upper surface. The planarization insulating layer PINS includes an organic insulating layer.

When external light propagating toward the display panel DP is reflected from the display panel DP back to an external user, the user may visually recognize the external light, like a mirror. To prevent this phenomenon, the anti-reflection layer RPL includes a plurality of color filters CF that display the same color as the pixels PX of the display panel DP. The color filters CF filter the external light into the same colors as the pixels PX. For example, the external light is not visually recognized by the user.

Figure 8:
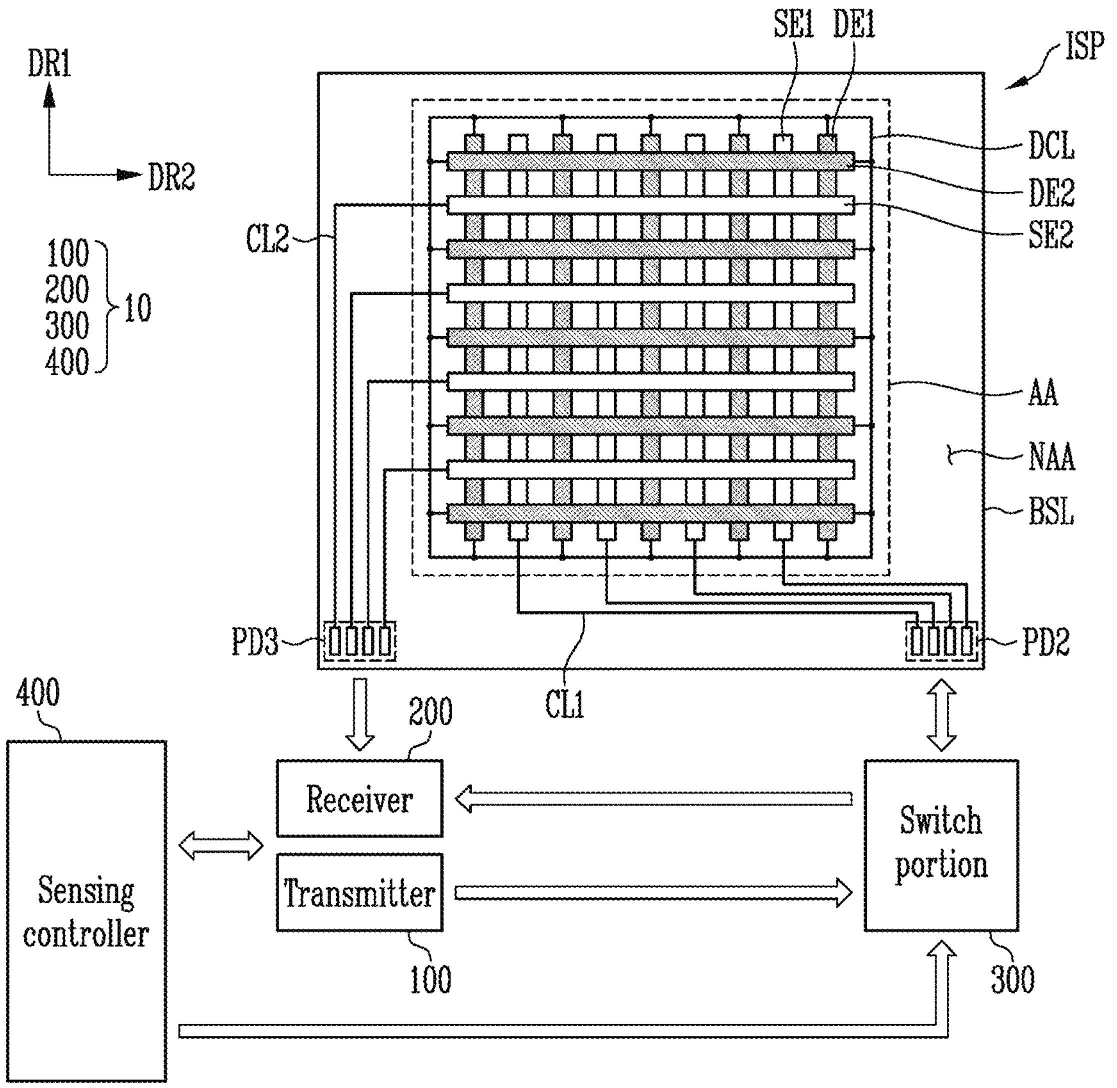
FIG. 8 is a top plan view of a portion of an electronic panel of FIG. 4.
Figure 9:
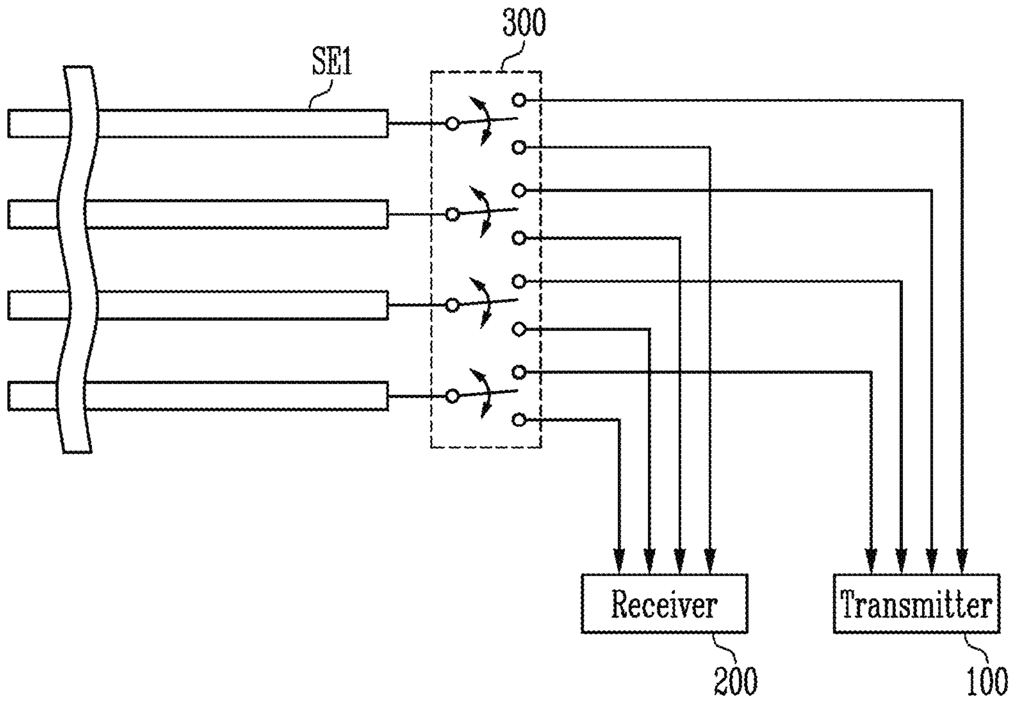
FIG. 9 shows an example of a switch portion of FIG. 8.

FIG. 8 is a top plan view of a portion of the electronic panel of FIG. 4, and FIG. 9 shows an example of a switch portion of FIG. 8.

FIG. 9 shows only a first sensing electrode SE1, a receiver 200, a transmitter 100, and a switch portion 3, for better comprehension and ease of illustration.

Referring to FIG. 7 and FIG. 8, in an embodiment, the electronic panel EP (see FIG. 4) includes a touch panel ISP and a touch panel driver 10 that drive the touch panel ISP.

The touch panel ISP include the base layer BSL, sensing electrodes SE1 and SE2, dummy electrodes DE1 and DE2, lines CL1 and CL2 that are electrically connected to the sensing electrodes SE1 and SE2, pads PD2 and PD3 that electrically connect the lines CL1 and CL2 to the touch panel driver 10, and a connection line DCL that connects the dummy electrodes DE1 and DE2.

An active area AA and a peripheral area NAA adjacent to the active area AA are defined in the base layer BSL. When viewed in a plan view, the active area AA overlaps the display area DA (see FIG. 6), and the peripheral area NAA overlaps the non-display area NDA (see FIG. 6).

The sensing electrodes SE1 and SE2 are disposed in the active area AA, and the second and third pads PD2 and PD3 are disposed in the peripheral area NAA. The second and third pads PD2 and PD3 are adjacent to a lower end of the touch panel ISP when viewed in a plan view. However, embodiments of the present disclosure are not necessarily limited to the positions of the second and third pads PD2 and PD3.

The first sensing electrode SE1 and the first dummy electrode DE1 extends in the first direction DR1 and are spaced apart in the second direction DR2. The first sensing electrode SE1 is connected to the second pad PD2 through the first line CL1. The second pad PD2 electrically connect the first sensing electrode SE1 to the touch panel driver 10.

The second sensing electrode SE2 and the second dummy electrode DE2 extend in the second direction DR2 and are spaced apart in the first direction DR1. The second sensing electrode SE2 is connected to the third pad PD3 through the second line CL2. The third pad PD3 electrically connects the second sensing electrode SE2 to the touch panel driver 10.

The first dummy electrodes DE1 are connected to each other through the connection line DCL, and at least two of the first dummy electrodes DE1 and the connection line DCL surround each first sensing electrode SE1. The connection line DCL is not connected to the first line CL1 or the second line CL2. For example, the first dummy electrodes DE1 form a coil that surrounds the first sensing electrode SE1. Accordingly, an eddy current can be formed in the first dummy electrodes DE1 by a second object that approaches the first sensing electrode SE1.

The first dummy electrodes DE1 electrically float with the first sensing electrode SE1. Accordingly, capacitance can form between the first dummy electrodes DE1 and the first sensing electrode SE1. Therefore, a (2-1)-th touch sensing signal, hereinafter shown in FIG. 12, which will be described below, is generated in the first sensing electrode SE1 due to the eddy current flowing through the first dummy electrodes DE1.

The second dummy electrodes DE2 are connected to each other through the connection line DCL, and at least two of the second dummy electrodes DE2 and the connection line DCL surround each second sensing electrode SE2. For example, the second dummy electrodes DE2 form a coil that surrounds the second sensing electrode SE2. Accordingly, an eddy current can form in the second dummy electrodes DE2 by the second object approaching the second sensing electrode SE2.

The second dummy electrodes DE2 electrically float with the second sensing electrode SE2. Accordingly, capacitance can form between the second dummy electrodes DE2 and the second sensing electrode SE2. Therefore, a (2-2)-th touch sensing signal, hereinafter shown in FIG. 13, which will be described below, is generated in the second sensing electrode SE2 due to the eddy current flowing through the second dummy electrodes DE2.

Figure 15:
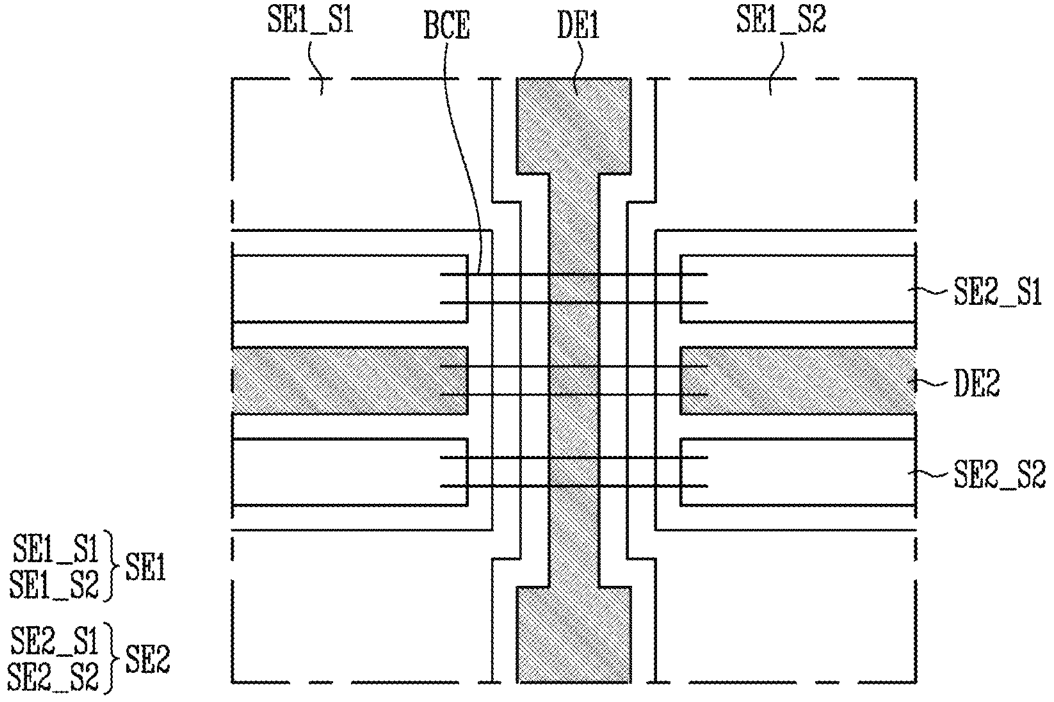
FIG. 15 is an enlarged view of a first area A1 of FIG. 14.

Although FIG. 8 shows that the second dummy electrode DE2 and the second sensing electrode SE2 are disposed on the first dummy electrode DE1 and the first sensing electrode SE1, embodiments of the present disclosure are not necessarily limited thereto. For example, as illustrated in FIG. 15 to be described below, both the first and second sensing electrodes SE1 and SE2 and the first and second dummy electrodes DE1 and DE2 can be disposed on the same layer. For example, in FIG. 8, in an area where one of the first sensing electrode SE1 or the second sensing electrode SE2 intersects another electrode, one of the first sensing electrode SE1 or the second sensing electrode SE2 is connected through a connection electrode, hereinafter shown in FIG. 15. For example, in FIG. 8, in an area where one of the first dummy electrode DE1 or the second dummy electrode DE2 intersects with another electrode, one of the first dummy electrode DE1 or the second dummy electrode DE2 is connected through a connection electrode, hereinafter shown in FIG. 15. For example, the connection electrode is formed with the first conductive pattern CTL1. However, embodiments of the present disclosure are not necessarily limited to a method in which each electrode is connected in the intersecting area.

Referring to FIG. 8 and FIG. 9, in an embodiment, the touch panel driver 10 includes a transmitter 100, a receiver 200, a switch portion 300, and a sensing controller 400 that controls the transmitter 100, the receiver 200, and the switch portion 300. In an embodiment, respective components of the touch panel driver 10 are formed as a circuit. However, embodiments of the present disclosure are not necessarily limited thereto, and in other embodiments of the present disclosure, the touch panel driver 10 may be implemented in the form of hardware, software, firmware, or an application-specific integrated circuit (ASIC).

The transmitter 100 transmits a signal to the touch panel ISP. The receiver 200 receives a signal from the touch panel ISP. A detailed description of these will be described below.

The switch portion 300 selectively connects the first sensing electrode SE1 to the transmitter 100 or the receiver 200. For example, the switch portion 300 includes switches that connect respective first sensing electrodes SE1 to the transmitter 100 or the receiver 200. Each switch is controlled by the sensing controller 400.

Figure 10:
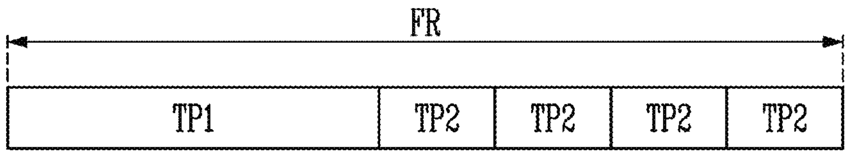
FIG. 10 shows an example in which a touch panel driver of FIG. 8 drives a touch panel.
Figure 11:
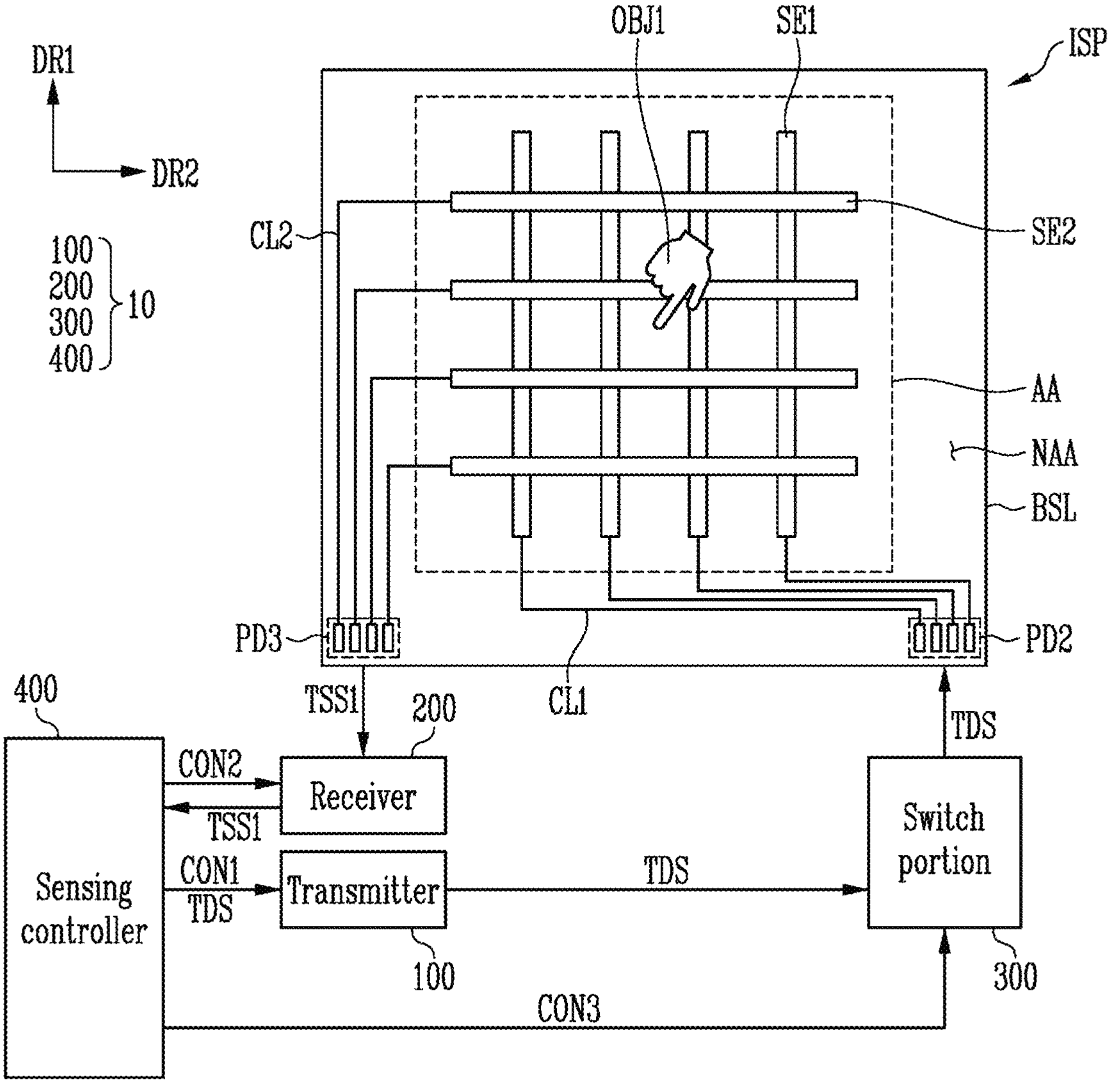
FIG. 11 shows an example in which a touch panel driver of FIG. 8 drives a touch panel in a first touch period.
Figure 12:
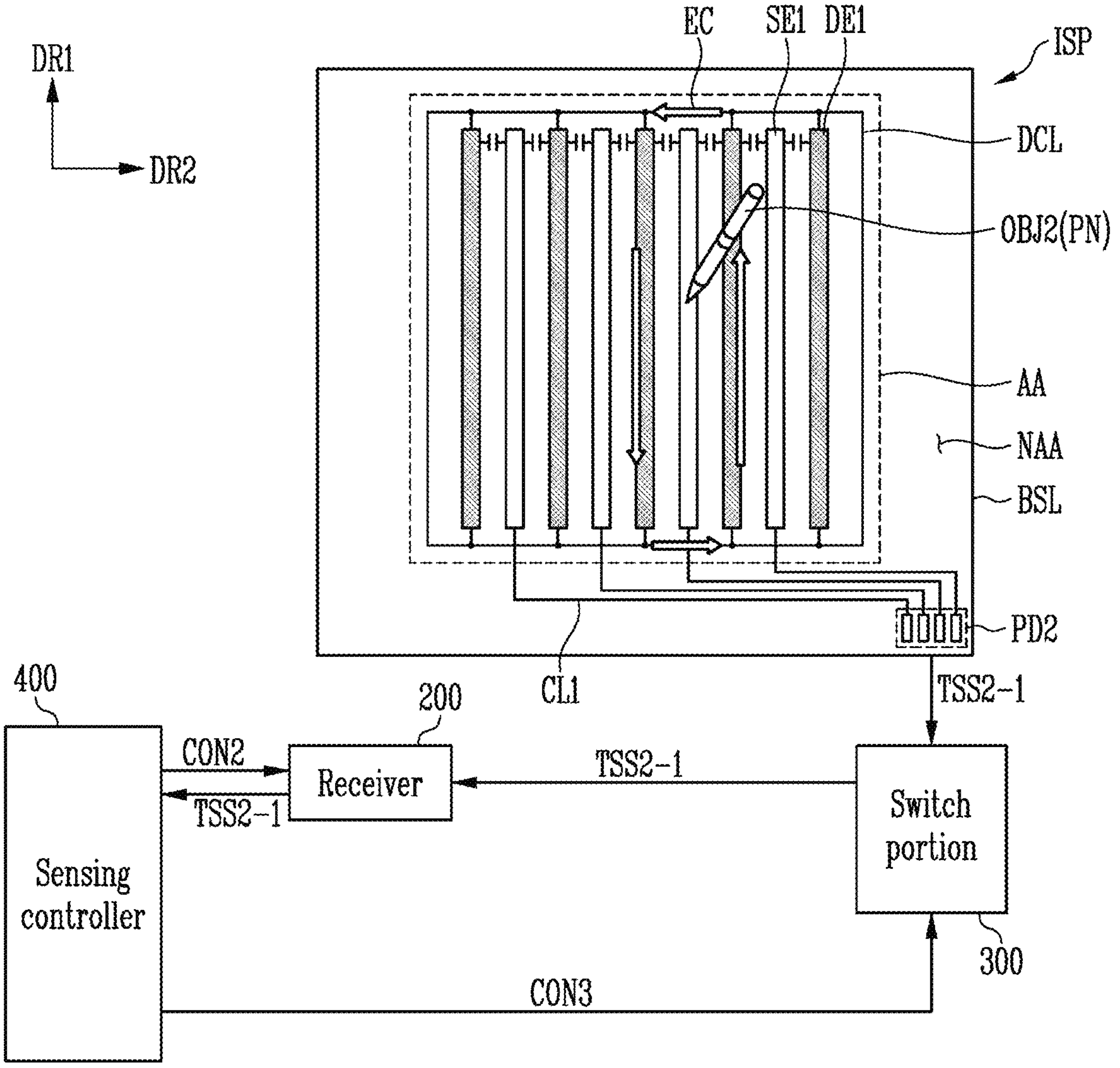
FIG. 12 and FIG. 13 show examples in which a touch panel driver of FIG. 8 drives a touch panel in a second touch period.
Figure 13:
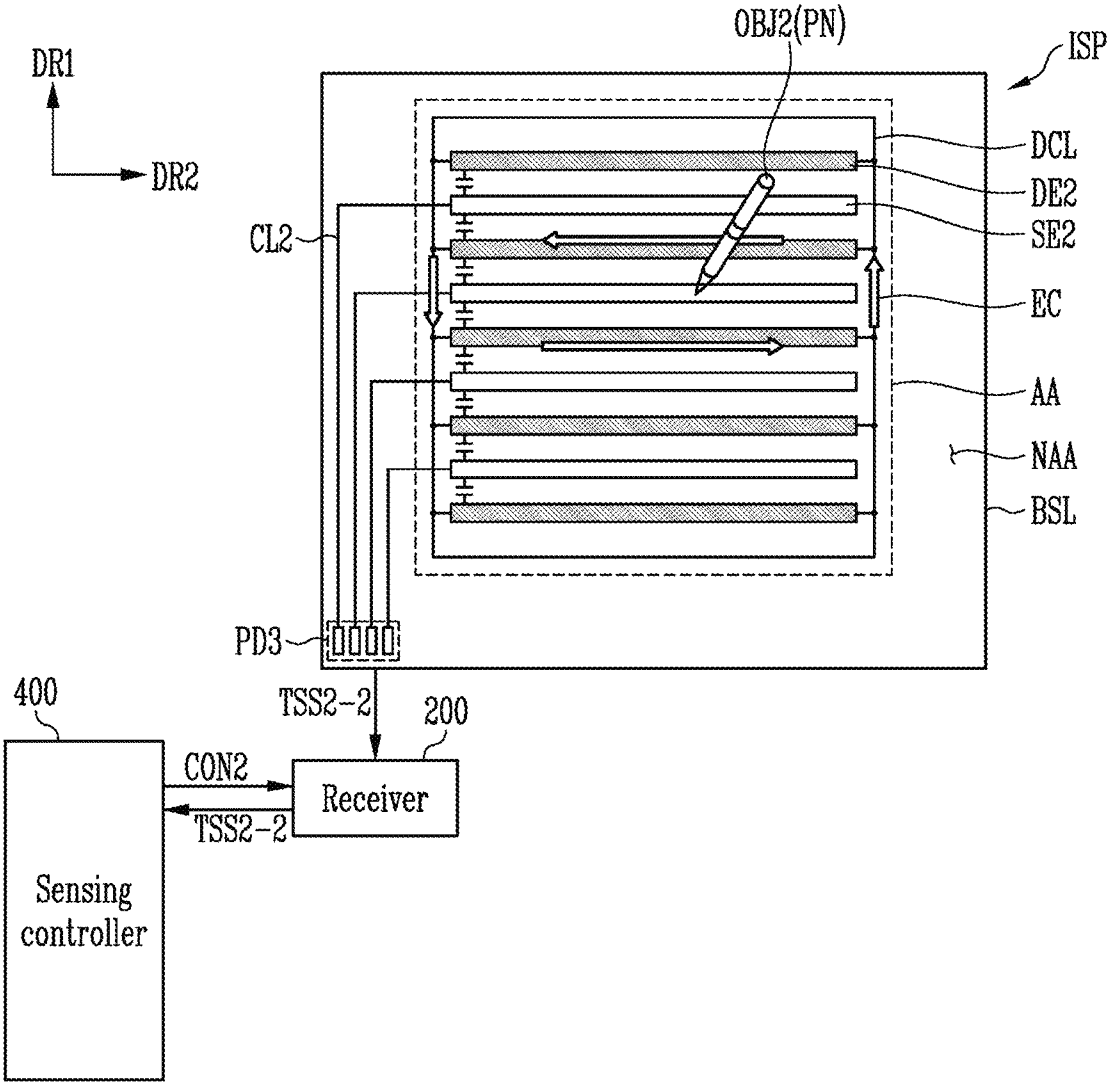

FIG. 10 shows an example in which a touch panel driver of FIG. 8 drives a touch panel, FIG. 11 shows an example in which a touch panel driver of FIG. 8 drives a touch panel in a first touch period, and FIG. 12 and FIG. 13 show an example in which a touch panel driver of FIG. 8 drives a touch panel in a second touch period.

For better comprehension and ease of illustration, the dummy electrodes DE1 and DE2 are omitted in FIG. 11; the second sensing electrode SE2, the second dummy electrode DE2, and the transmitter 100 are omitted in FIG. 12; and the first sensing electrode SE1, the first dummy electrode DE1, the transmitter 100, and the switch portion 300 are omitted in FIG. 13.

In FIG. 11 to FIG. 13, the input/output signals of the transmitter 100 and the receiver 200 are shown by the same reference symbol, but are not necessarily the same. For example, the transmitter 100 and the receiver 200 output the received signal at different frequencies, such as an output frequency or an input frequency.

FIG. 12 shows that coordinates, such as x-axis coordinates, of a second object OBJ2 in the first direction DR1 are detected in a second touch period TP2, and FIG. 13 shows that coordinates, such as y-axis coordinates, of the second object OBJ2 in the second direction DR2 are detected in the second touch period TP2.

Referring to FIG. 10 to FIG. 13, in an embodiment, the touch panel ISP is driven in time-division manner by the touch panel driver 10 (refer to FIG. 8) and includes the first touch period TP1 and the second touch period TP2. The touch panel driver 10 (see FIG. 8) detects the coordinates of the first object OBJ1 in the first touch period TP1 of one frame FR, and detects the coordinates of the second object OBJ2 in the second touch period TP2 of the one frame FR. The first touch period TP1 and the second touch period TP2 may be repeated.

In an embodiment, the frequency of the first touch period TP1 is less than the frequency of the second touch period TP2. For example, in one frame FR, the first touch period TP1 is repeated once, and the second touch period TP2 is repeated four times. For example, the frequency of the first touch period TP1 is 120 Hz, and the frequency of the second touch period TP2 is 480 Hz.

Referring to FIG. 10 and FIG. 11, the first and second sensing electrodes SE1 and SE2 are driven in the first touch period TP1 to detect the first input from the first object OBJ1. For example, in the first touch period TP1, the touch panel ISP is driven in a mutual capacitance method. For example, the touch panel driver 10 (see FIG. 8) transmits the touch driving signal TDS to the first sensing electrode SE1 during the first touch period TP1 and receives the first touch sensing signal TSS1 from the second sensing electrode SE2. Capacitance forms between the first sensing electrode SE1 and the second sensing electrode SE2. When the first input is received by the touch panel ISP, the capacitance can vary. The touch panel driver 10 (see FIG. 8) detects the first input based on the change in capacitance. For example, the touch panel driver 10 (see FIG. 8) detects the coordinates of the first object OBJ1 based on the first touch sensing signal TSS1.

For example, the sensing controller 400 outputs to the switch portion 300 a third control signal CON3 that controls the switch portion 300. In the first touch period TP1, the switch portion 300 connects the first sensing electrodes SE1 to the transmitter 100 based on the third control signal CON3.

For example, the sensing controller 400 outputs to the transmitter 100 a first control signal CON1 and the touch driving signal TDS that includes an output frequency. The transmitter 100 transmits the touch driving signal TDS to the first sensing electrodes SE1 at the output frequency. However, the output frequency of each of the first sensing electrodes SE1 does not necessarily have to be the same.

For example, the sensing controller 400 outputs the second control signal CON2 that includes an input frequency to the receiver 200. The receiver 200 receives the first touch sensing signal TSS1 at the input frequency from the second sensing electrodes SE2. The receiver 200 transmits the first touch sensing signal TSS1 received at the input frequency to the sensing controller 400.

Referring to FIG. 11 and FIG. 12, in an embodiment, in the second touch period TP2, the second object OBJ2 generates an eddy current EC in the first dummy electrode DE1. For example, when the second object OBJ2 is an input device PN that generates a magnetic field, and the second object OBJ2 approaches the touch panel ISP, and eddy current is generated. The first sensing electrode SE1 forms a capacitance with the first dummy electrodes DE1. A (2-1)-th touch sensing signal TSS2-1 is generated in the first sensing electrode SE1 due to the eddy current EC generated in the first dummy electrodes DE1. The touch panel driver 10 (see FIG. 8) detects a second input based on the (2-1)-th touch sensing signal TSS2-1. For example, the touch panel driver 10 (see FIG. 8) detects the coordinates in the second direction DR2 of the second object OBJ2 based on the (2-1)-th touch sensing signal TSS2-1.

For example, the sensing controller 400 outputs to the switch portion 300 the third control signal CON3 that controls the switch portion 300. In the second touch period TP2, the switch portion 300 connects the first sensing electrodes SE1 to the receiver 200 based on the third control signal CON3.

For example, the sensing controller 400 outputs the second control signal CON2 that includes the input frequency to the receiver 200. The receiver 200 receives the (2-1)-th touch sensing signal TSS2-1 at the input frequency from the second sensing electrodes SE2. The receiver 200 transmits the (2-1)-th touch sensing signal TSS2-1 received at the input frequency to the sensing controller 400.

In an embodiment, the input frequency in the second touch period TP2 matches the generation frequency of the magnetic field of the second object OBJ2. However, embodiments of the present disclosure are not necessarily limited thereto.

Referring to FIG. 11 and FIG. 13, in an embodiment, in the second touch period TP2, the second object OBJ2 generates an eddy current EC in the second dummy electrode DE2. For example, when the second object OBJ2 is an input device PN that generates a magnetic field, and the second object OBJ2 approaches the touch panel ISP, and eddy current is generated. The second sensing electrode SE2 forms a capacitance with the second dummy electrodes DE2. A (2-2)-th touch sensing signal TSS2-2 is generated in the second sensing electrode SE2 due to the eddy current EC generated in the second dummy electrodes DE2. The touch panel driver 10 (see FIG. 8) detects a second input based on the (2-2)-th touch sensing signal TSS2-2. For example, the touch panel driver 10 (see FIG. 8) detects the coordinates in the first direction DR1 of the second object OBJ2 based on the (2-2)-th touch sensing signal TSS2-2.

For example, the sensing controller 400 outputs the second control signal CON2 that includes the input frequency to the receiver 200. The receiver 200 receives the (2-2)-th touch sensing signal TSS2-2 at the input frequency from the second sensing electrodes SE2. The receiver 200 transmits the (2-2)-th touch sensing signal TSS2-2 received at the input frequency to the sensing controller 400.

In an embodiment, the input frequency in the second touch period TP2 matches the generation frequency of the magnetic field of the second object OBJ2. However, embodiments of the present disclosure are not necessarily limited thereto.

Figure 14:
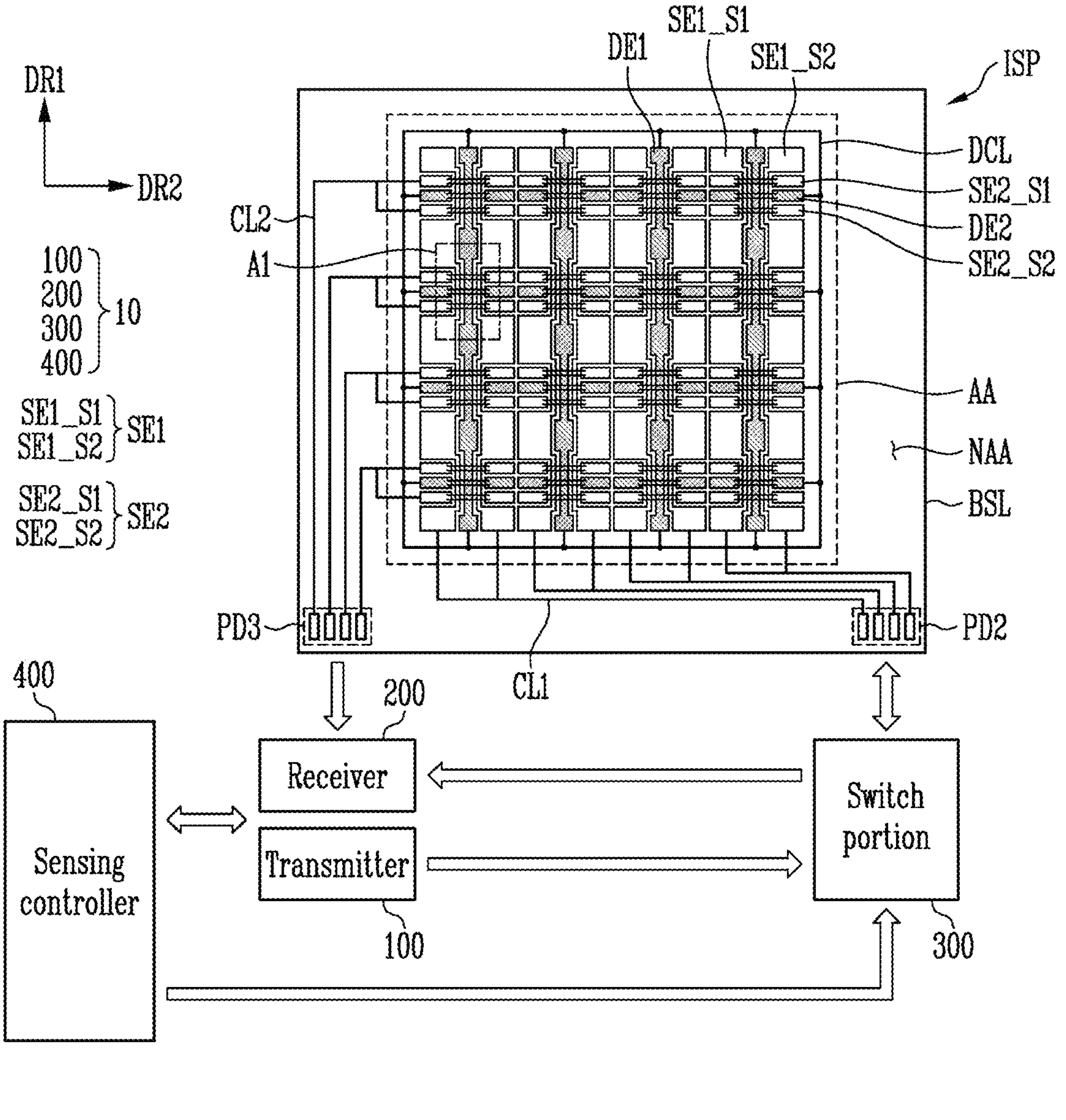
FIG. 14 shows an example of sensing electrodes and dummy electrodes of FIG. 8.

FIG. 14 shows an example of sensing electrodes and dummy electrodes of FIG. 8, and FIG. 15 shows an enlarged view of a first area A1 of FIG. 14.

Referring to FIG. 8, FIG. 14, and FIG. 15, in an embodiment, the sensing electrodes SE1 and SE2 and the dummy electrodes DE1 and DE2 are formed by separating the second conductive pattern CTL2 in a predetermined area. For example, as shown in FIG. 15, the first sensing electrodes SE1, the second sensing electrodes SE2, the first dummy electrodes DE1, and the second dummy electrodes DE2 electrically float with each other due to the predetermined area.

The first conductive pattern CTL1 forms a connection electrode BCE that connects a portion of the second conductive pattern CTL2. For example, the second sensing electrode SE2 extends in the second direction DR2 while electrically floating with the first sensing electrode SE1 and the first dummy electrode DE1 through the connection electrode BCE. For example, the second dummy electrode DE2 extends in the second direction DR2 while electrically floating with the first sensing electrode SE1 and the first dummy electrode DE1 through the connection electrode BCE.

The first sensing electrode SE1 includes a first sub-sensing electrode SE1_S1 and a second sub-sensing electrode SE1_S2. At least one first dummy electrode DE1 is disposed between the first sub-sensing electrode SE1-S1 and the second sub-sensing electrode SE1_S2.

The second sensing electrode SE2 includes a first sub-sensing electrode SE2_S1 and a second sub-sensing electrode SE2_S2. At least one second dummy electrode DE2 is disposed between the first sub-sensing electrode SE2_S1 and the second sub-sensing electrode SE2_S2.

Figure 16:
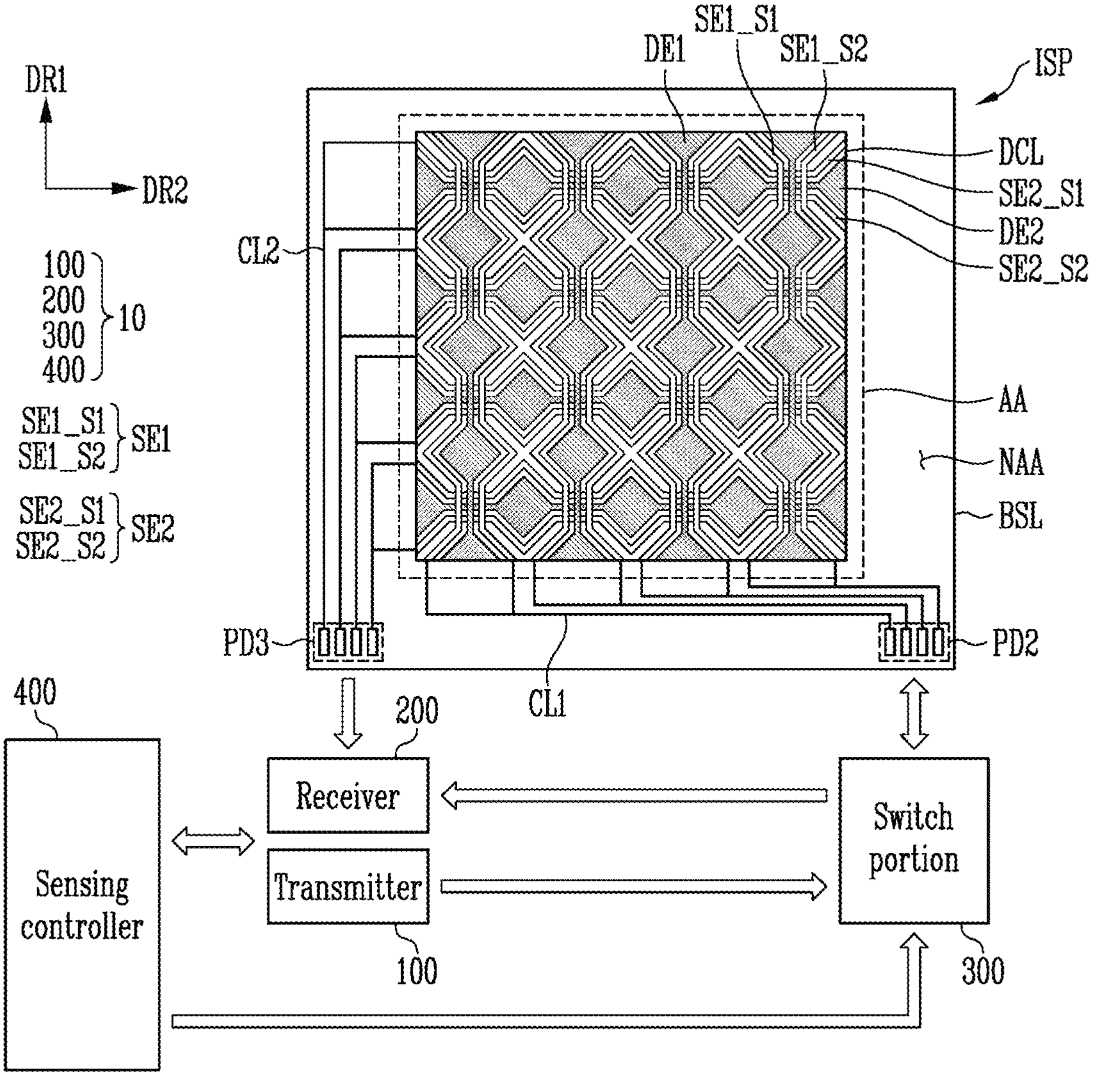
FIG. 16 shows an example of sensing electrodes and dummy electrodes of FIG. 8.

FIG. 16 illustrates an example of the sensing electrodes and the dummy electrodes of FIG. 8.

Referring to FIG. 6, FIG. 8, and FIG. 16, in an embodiment, the pixels PX have various structures. For example, as shown in FIG. 16, when the pixels PX have a diamond pixel (DIAMOND PIXEL™) structure, the sensing electrodes SE1 and SE2 avoid a rhombus-shaped light emitting area. However, embodiments of the present disclosure are not necessarily limited to the structure of the pixels PX, and the shapes of the sensing electrodes SE1 and SE2 and the dummy electrodes DE1 and DE2 vary according to the structure of the pixels PX.

Figure 17:
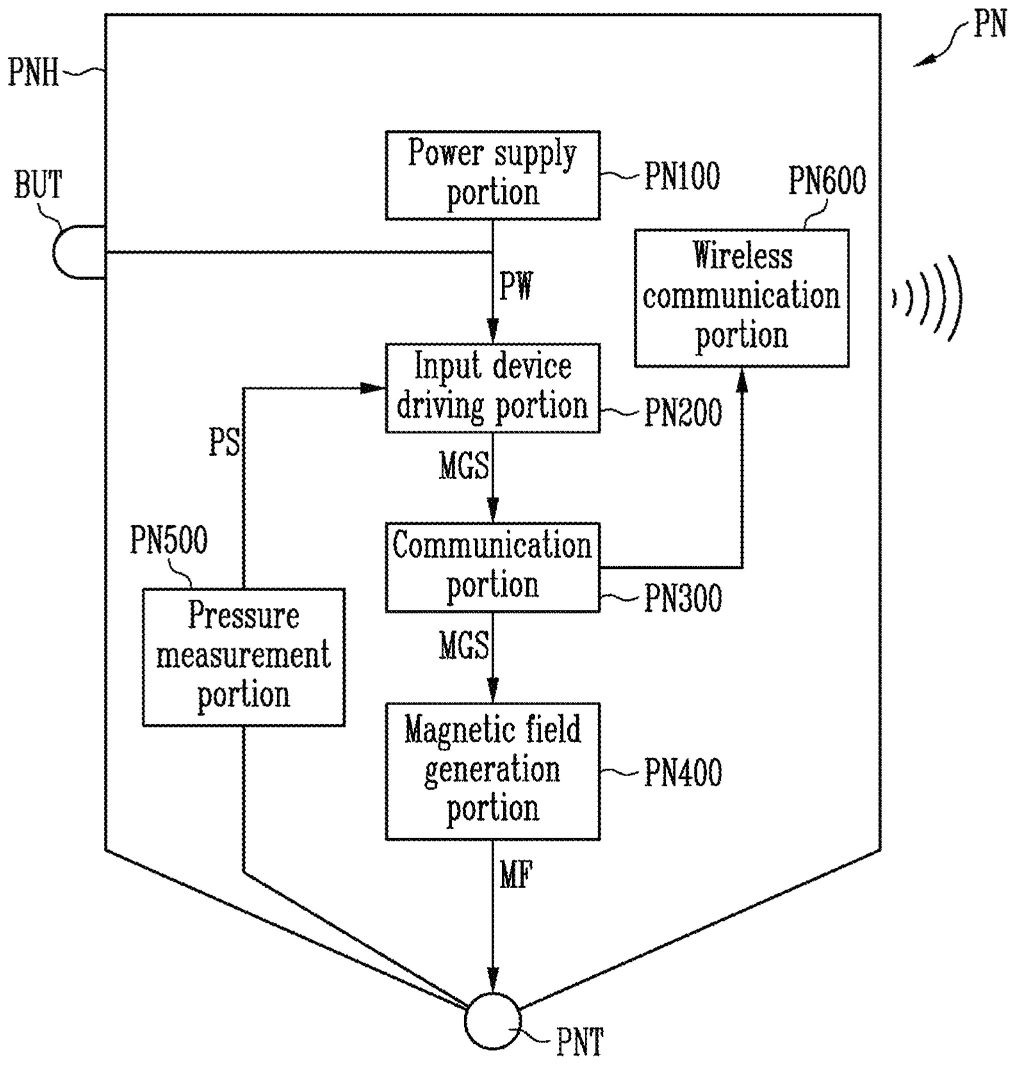
FIG. 17 shows an example of an input device of FIG. 1.

FIG. 17 shows an example of the input device of FIG. 1.

Referring to FIG. 10, FIG. 12, FIG. 13, and FIG. 17, in an embodiment, a second input from the input device PN is detected in the second touch period TP2. The input device PN generates an eddy current in at least one of the dummy electrodes DE1 and DE2.

The input device PN includes a housing PNH, a pen tip PNT, a button portion BUT, a power supply portion PN100, an input device driving portion PN200, a communication portion PN300, a magnetic field generation portion PN400, a pressure measurement portion PN500, and a wireless communication portion PN600.

The housing PNH has a pen shape. An accommodation space is formed inside the housing PNH. The power supply portion PN100, the input device driving portion PN200, the communication portion PN300, the magnetic field generation portion PN400, the pressure measurement portion PN500, and the wireless communication portion PN600 are accommodated in the accommodation space inside the housing PNH.

The pen tip PNT is disposed at an end portion of the housing PNH. For example, a portion of the pen tip PNT is externally exposed by the housing PNH, and the remaining portion of the pen tip PNT is inserted into the housing PNH.

The power supply portion PN100 supplies a power PW to the input device driving portion PN200. The power supply portion PN100 includes a battery or high-capacity capacitor.

The button portion BUT blocks the power PW supplied to the input device driving portion PN200. For example, a user can turn the input device PN on/off through the button portion BUT.

The input device driving portion PN200 generates a magnetic field generation signal MGS. The magnetic field generation portion PN400 generates a magnetic field MF that corresponds to the magnetic field generation signal MGS. The input device driving portion PN200 adjusts the generation frequency and intensity of the magnetic field MF through the magnetic field generation signal MGS.

For example, the magnetic field generation portion PN400 includes a coil. For example, the magnetic field generation signal MGS is transmitted to the coil to generate the magnetic field MF, and the generated magnetic field MF is output from the input device PN through the pen tip PNT. For example, when the input device PN approaches the sensing electrodes SE1 and SE2, eddy currents form in the dummy electrodes DE1 and DE2. For example, when the input device PN moves away from the sensing electrodes SE1 and SE2 surrounded by the dummy electrodes DE1 and DE2 in which the eddy current is formed, the eddy current is generated in the coil, and the power supply portion PN100 is charged by the eddy current.

In an embodiment, the input device PN further includes the pressure measurement portion PN500 that measures the pressure PS of the input device PN, and the input device driving portion PN200 generates the magnetic field generation signal MGS based on the pressure PS of the input device PN. The pressure PS of the input device PN is applied by the input device PN to the touch panel ISP.

For example, the input device driving portion PN200 adjusts the magnetic field generation signal MGS according to the pressure PS of the input device PN. That is, the (2-1)-th and (2-2)-th touch sensing signals TSS2-1 and TSS2-2 vary according to the pressure PS of the input device PN. Accordingly, when detecting the second input, the display device DD (see FIG. 1) detects not only the coordinates of the second input but also the intensity of the second input.

The communication portion PN300 transmits the received signal to at least one of the components of the input device PN. For example, the communication portion PN300 transmits the magnetic field generation signal MGS to the magnetic field generation portion PN400. In FIG. 17, the input and output signals of the communication portion PN300 are indicated by the same reference symbol, but they do not necessarily have to be the same. For example, the communication portion PN300 converts the magnetic field generation signal MGS into a current that generates the magnetic field MF of a specific frequency and/or a specific intensity when the magnetic field generation signal MGS flows through the coil.

The wireless communication portion PN600 performs wireless communication with an external device. For example, the wireless communication portion PN600 performs Bluetooth communication with an external device. For example, the wireless communication portion PN600 transmits information on the control of the magnetic field MF to the display device DD (see FIG. 1) or a host system that communicates with the display device DD (see FIG. 1). For example, the wireless communication portion PN600 transmits whether the power PW is provided to the input device driving portion PN200 to the display device DD (see FIG. 1) or a host system that communicates with the display device DD (see FIG. 1).

In an embodiment, the input device PN further includes the pressure measurement portion PN500 that measures the pressure PS of the input device PN, and the pressure PS of the input device PN is transmitted to the display device DD (see FIG. 1). For example, the wireless communication portion PN600 transmits the pressure PS of the input device PN to the display device DD (see FIG. 1). The display device DD (see FIG. 1) directly compares the pressure PS of the input device PN with the detected second input. For example, the magnetic field generation signal MGS generated by the input device driving portion PN200 is not affected by the pressure PS of the input device PN. In an embodiment, the input device driving portion PN200 provides the pressure PS of the input device PN to the display device DD (see FIG. 1). For example, the input device driving portion PN200 provides the pressure PS of the input device PN to the display device DD (see FIG. 1) or the host system that communicates with the display device DD (see FIG. 1) through the communication portion PN300 and the wireless communication portion PN600. In an embodiment, the pressure measurement portion PN500 provides the pressure PS of the input device PN to the display device DD (see FIG. 1) or the host system that communicates with the display device DD (see FIG. 1) without passing through the input device driving portion PN200 through the communication portion PN300 and the wireless communication portion PN600.

Figure 18:
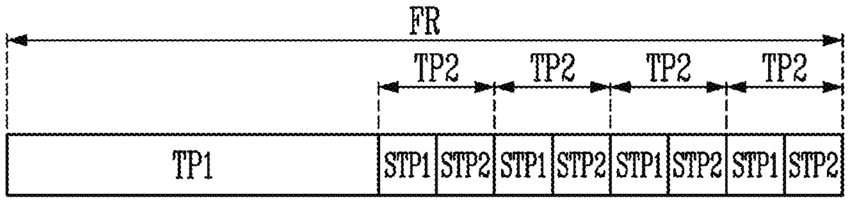
FIG. 18 shows an example in which a touch panel driver of a touch system drives a touch panel according to embodiments of the present disclosure.
Figure 19:
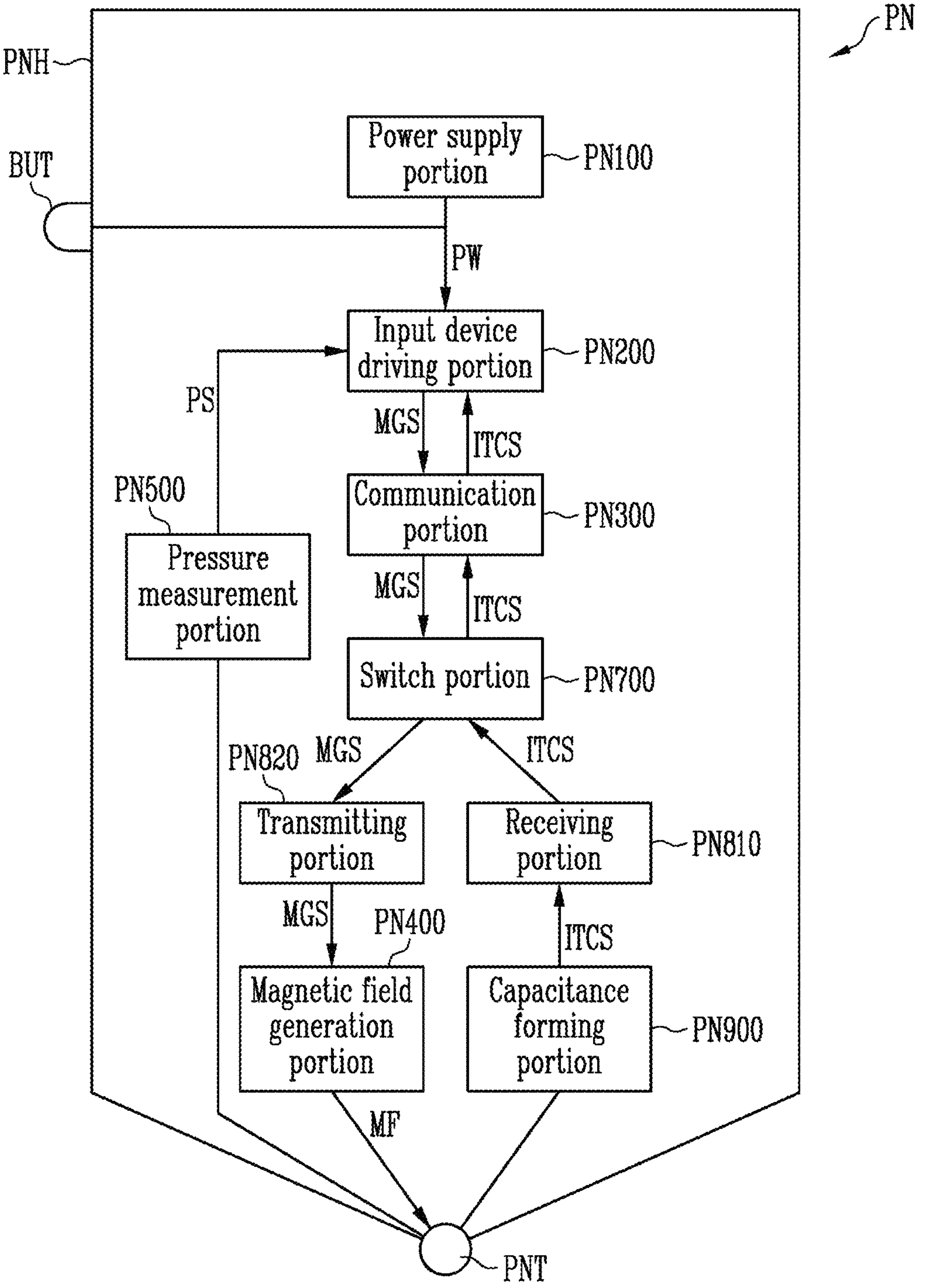
FIG. 19 shows an example of an input device of the touch system of FIG. 18.

FIG. 18 shows an example in which a touch panel driver of a touch system drives a touch panel according to embodiments of the present disclosure, and FIG. 19 shows an example of an input device of the touch system of FIG. 18.

A touch system according to embodiments is substantially the same as an embodiment of FIG. 1 except for the input device PN and the first and second sub-touch periods STP1 and STP2, so the same reference numbers and reference symbols are used for the same or similar components, and redundant descriptions are omitted.

In FIG. 19, in an embodiment, the input and output signals of the receiving portion PN810 and the transmitting portion PN820 are indicated by the same reference symbol, but they are not necessarily the same. For example, the receiving portion PN810 and the transmitting portion PN820 may output the received signal at different frequencies.

In FIG. 19, the input and output signals of the communication portion PN300 are indicated by the same reference symbol, but they are not necessarily the same. For example, the communication portion PN300 converts the magnetic field generation signal MGS into a current that generates the magnetic field MF of a specific frequency and/or a specific intensity when the magnetic field generation signal MGS flows through the coil. For example, the communication portion PN300 converts a signal ITCS that corresponds to the in-touch signal into a signal that can be recognized by the input device driver PN200.

Referring to FIG. 8, FIG. 18, and FIG. 19, in an embodiment, the touch panel ISP be driven in a time-division manner by the touch panel driver 10 in the first touch period TP1 and the second touch period TP2. The touch panel driver 10 detects the coordinates of the first object OBJ1 (see FIG. 11) in the first touch period TP1 of one frame FR, and detects the coordinates of the second object OBJ2 (see FIG. 12), such as the input device PN, in the second touch period TP2 of one frame FR. The first touch period TP1 and the second touch period TP2 are repeated.

The second touch period TP2 includes a first sub-touch period STP1 and a second sub-touch period STP2. In the first sub-touch period STP1, the touch panel driver 10 detects whether the input device PN touches (or inputs) the touch panel ISP. When the input device PN touches (or inputs) the touch panel ISP in the first sub-touch period STP1, the input device PN generates the magnetic field MF in the second sub-touch period STP2.

The input device PN includes a housing PNH, a pen tip PNT, a button portion BUT, a power supply portion PN100, an input device driving portion PN200, a communication portion PN300, a magnetic field generation portion PN400, a pressure measurement portion PN500, a switch portion PN700, a receiving portion PN810, a transmitting portion PN820, and a capacitance forming portion PN900.

The descriptions of the housing PNH, the pen tip PNT, the button portion BUT, the power supply portion PN100, the input device driving portion PN200, the communication portion PN300, the magnetic field generation portion PN400, and the pressure measurement portion PN500 have been provided with reference to FIG. 17, so redundant descriptions thereof will be omitted.

The capacitance forming portion PN900 forms a capacitance with the first sensing electrode SE1 when the input device PN approaches the touch panel ISP. For example, the capacitance forming portion PN900 includes a conductive material. For example, the capacitance forming portion PN900 includes an electrode.

The touch panel driver 10 outputs an in-touch signal to the first sensing electrode SE1 in the first sub-touch period STP1. The receiving portion PN810 receives the signal ITCS that corresponds to the in-touch signal generated by the capacitance between the capacitance forming portion PN900 and the first sensing electrode SE1.

The switch portion PN700 selectively connects the input device driving portion PN200 to the receiving portion PN810 or the transmitting portion PN820. The switch portion PN700 connects the input device driving portion PN200 to send or receive signals through the communication portion PN300.

The receiving portion PN810 transmits the received signal to the input device driving portion PN200 through the communication portion PN300. The input device driving portion PN200 detects whether the input device PN touches (or inputs) the touch panel ISP based on the signal ITCS that corresponds to the in-touch signal.

The input device driving portion PN200 controls the switch portion PN700. For example, the input device driving portion PN200 transmits to the switch portion PN700 a control signal that controls the switch portion PN700.

When the input device PN touches (or inputs) the touch panel ISP, the input device driving portion PN200 transmits the magnetic field generation signal MGS to the magnetic field generation portion PN400. For example, when the input device driving portion PN200 receives the signal ITCS that corresponds to the in-touch signal, the input device driving portion PN200 controls the switch portion PN700 so that the switch portion PN700 connects the input device driving portion PN200 to the transmitting portion PN820. In addition, the input device driving portion PN200 transmits the magnetic field generation signal MGS to the magnetic field generation portion PN400 through the communication portion PN300 and the transmitting portion PN820.

The operation in the second sub-touch period STP2 when the input device PN touches (or inputs) the touch panel ISP is substantially the same as the operation in the second touch period TP2 described with reference to FIG. 12 and FIG. 13, so a redundant description will be omitted.

When the input device PN does not touch (or input) the touch panel ISP, the input device driving portion PN200 does not transmit the magnetic field generation signal MGS to the magnetic field generation portion PN400. For example, when the input device driving portion PN200 does not receive the signal ITCS that corresponds to the in-touch signal in the first sub-touch period TSP1, the input device driving portion PN200 is connected to the receiving portion PN810 in the second sub-touch period TSP2.

Embodiments of the present disclosure can be incorporated into a display device and an electronic device that includes the same. For example, embodiments of the present disclosure can be incorporated into a digital TV, a 3D TV, a mobile phone, a smart phone, a tablet computer, a VR device, a PC, a home electronic device, a laptop computer, a PDA, a PMP, a digital camera, a music player, a portable game console, a navigation, etc.

While embodiments of this disclosure have been described in connection with what is presently considered to be practical embodiments, it is to be understood that embodiments are not limited to the disclosed embodiments, but, on the contrary, are intended to cover various modifications and equivalent arrangements included within the spirit and scope of the appended claims.

What is claimed is:

1. A display device, comprising: a touch panel that includes first dummy electrodes that extend in a first direction and are connected to each other, second dummy electrodes that extend in a second direction that crosses the first direction and are connected to each other, a first sensing electrode disposed between the first dummy electrodes and that electrically floats with the first dummy electrodes, wherein the first sensing electrode includes a first sub-sensing electrode and a second sub-sensing electrode, wherein the first sub-sensing electrode and the second sub-sensing electrode of the first sensing electrode are separated by a gap therebetween, wherein none of the first dummy electrodes are disposed in the gap, at least one of the first dummy electrodes is disposed between the first sub-sensing electrode of the first sensing electrode located on one side of the at least one of the first dummy electrode and the second sub-sensing electrode of an adjacent first sensing electrode located on an opposite side of the at least one of the first dummy electrode, and the first dummy electrodes and the gaps alternate with each other, and a second sensing electrode disposed between the second dummy electrodes and that electrically floats with the second dummy electrodes; and a touch panel driver that drives the touch panel.

2. The display device of claim 1, wherein
- the first dummy electrodes are connected to each other through a connection line,
- at least two of the first dummy electrodes and the connection line surround the first sensing electrode,
- the second dummy electrodes are connected to each other through the connection line, and
- at least two of the second dummy electrodes and the connection line surround the second sensing electrode.

3. The display device of claim 1, wherein
- the first dummy electrodes and the first sensing electrode are formed on the same layer.

4. The display device of claim 3, wherein
- the first dummy electrodes, the second dummy electrodes, the first sensing electrode, and the second sensing electrode are formed on the same layer.

5. The display device of claim 1, wherein
- the first dummy electrodes and the second dummy electrodes are connected to each other.

6. The display device of claim 1, wherein the touch panel driver
- detects coordinates of a first object in a first touch period of one frame and
- detects coordinates of a second object in a second touch period of the one frame.

7. The display device of claim 6, wherein the touch panel driver
- transmits a touch driving signal to the first sensing electrode in the first touch period,
- receives a first touch sensing signal from the second sensing electrode in the first touch period, and
- detects the coordinates of the first object based on the first touch sensing signal.

8. The display device of claim 6, wherein the touch panel driver
- receives a (2-1)-th touch sensing signal from the first sensing electrode in the second touch period,
- receives a (2-2)-th touch sensing signal from the second sensing electrode in the second touch period, and
- detects the coordinates of the second object based on the (2-1)-th touch sensing signal and the (2-2)-th touch sensing signal.

9. The display device of claim 8, wherein the touch panel driver
- detects the coordinates of the second object in the second direction based on the (2-1)-th touch sensing signal, and
- detects the coordinates of the second object in the first direction based on the (2-2)-th touch sensing signal.

10. The display device of claim 6, wherein
- the second object generates an eddy current in at least one of the first dummy electrodes or the second dummy electrodes.

11. The display device of claim 6, wherein
a frequency of the first touch period is less than a frequency of the second touch period.

12. The display device of claim 6, wherein the touch panel driver includes
a receiver that receives a signal from the touch panel;
a transmitter that transmits a signal to the touch panel;
a switch portion that selectively connects the first sensing electrode to the receiver or the transmitter; and
a sensing controller that controls the receiver, the transmitter, and the switch portion.

13. The display device of claim 12, wherein the switch portion
connects the first sensing electrode to the transmitter in the first touch period, and
connects the second sensing electrode to the receiver in the second touch period.

14. The display device of claim 6, wherein
the second touch period includes a first sub-touch period and a second sub-touch period, and
the touch panel driver
transmits an in-touch signal to the first sensing electrode in the first sub-touch period,
receives a (2-1)-th touch sensing signal from the first sensing electrode in the second sub-touch period,
receives a (2-2)-th touch sensing signal from the second sensing electrode in the second sub-touch period, and
detects coordinates of the second object based on the (2-1)-th touch sensing signal and the (2-2)-th touch sensing signal.

15. An electronic device, comprising:
first dummy electrodes that extend in a first direction and are connected to each other;
second dummy electrodes that extend in a second direction that crosses the first direction and are connected to each other;
a first sensing electrode disposed between the first dummy electrodes and that electrically floats with the first dummy electrodes wherein the first sensing electrode includes a first sub-sensing electrode and a second sub-sensing electrode, wherein the first sub-sensing electrode and the second sub-sensing electrode of the first sensing electrode are separated by a gap therebetween, wherein none of the first dummy electrodes are disposed in the gap, at least one of the first dummy electrodes is disposed between the first sub-sensing electrode of the first sensing electrode located on one side of the at least one of the first dummy electrode and the second sub-sensing electrode of an adjacent first sensing electrode located on an opposite side of the at least one of the first dummy electrode, and the first dummy electrodes and the gaps alternate with each other;
a second sensing electrode disposed between the second dummy electrodes and that electrically floats with the second dummy electrodes; and
a touch panel driver that detects coordinates of a first object in a first touch period of one frame and detects coordinates of a second object in a second touch period of the one frame.

* * * * *